(12) United States Patent
Nosaka

(10) Patent No.: US 11,611,331 B2
(45) Date of Patent: Mar. 21, 2023

(54) MULTIPLEXER, RADIO-FREQUENCY FRONT-END CIRCUIT, COMMUNICATION APPARATUS, AND ELASTIC WAVE FILTER

(71) Applicant: Murata Manufacturing Co., Ltd., Nagaokakyo (JP)

(72) Inventor: Koji Nosaka, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 37 days.

(21) Appl. No.: 17/033,949

(22) Filed: Sep. 28, 2020

(65) Prior Publication Data

US 2021/0013871 A1  Jan. 14, 2021

Related U.S. Application Data

(63) Continuation of application No. PCT/JP2019/008304, filed on Mar. 4, 2019.

(30) Foreign Application Priority Data

Mar. 28, 2018 (JP) .............................. JP2018-061588

(51) Int. Cl.
*H03H 9/70* (2006.01)
*H03H 9/60* (2006.01)
(Continued)

(52) U.S. Cl.
CPC .............. *H03H 9/605* (2013.01); *H03H 9/13* (2013.01); *H03H 9/70* (2013.01); *H04B 1/40* (2013.01)

(58) Field of Classification Search
CPC . H03H 9/605; H03H 9/13; H03H 9/70; H04B 1/40
See application file for complete search history.

(56) References Cited

U.S. PATENT DOCUMENTS

2009/0322444 A1* 12/2009 Tanaka .................... H03H 9/725
                                                        333/132
2010/0110940 A1*  5/2010 Hara ....................... H03H 9/725
                                                        333/133
(Continued)

FOREIGN PATENT DOCUMENTS

DE   102018104118 A1 *  8/2018
JP       2004-343735 A     12/2004
(Continued)

OTHER PUBLICATIONS

International Search Report and Written Opinion dated May 7, 2019 for PCT/JP2019/008304 filed on Mar. 4, 2019, 10 pages including English Translation of the International Search Report.

(Continued)

*Primary Examiner* — Dinh T Le
(74) *Attorney, Agent, or Firm* — Xsensus LLP

(57) ABSTRACT

A multiplexer includes a first filter located between a common terminal and a first terminal to pass a signal in a first passband, and a second filter located between the common terminal and a second terminal to pass a signal in a second passband. A first series arm circuit included in the first filter includes a first series arm resonator and a second series arm resonator. The first series arm circuit is connected to the common terminal not through a circuit including an elastic wave resonator and a connecting point of the circuit. The first series arm circuit has a first antiresonance frequency and a second antiresonance frequency higher than the first antiresonance frequency. The second antiresonance frequency is higher than a higher edge of the first passband. The first antiresonance frequency is at or lower than a higher edge of the second passband.

19 Claims, 37 Drawing Sheets

(51) Int. Cl.
   *H03H 9/13*   (2006.01)
   *H04B 1/40*   (2015.01)

(56) References Cited

U.S. PATENT DOCUMENTS

2011/0299432 A1*  12/2011  Caron ...................... H04B 1/52
                                                        370/277
2016/0218695 A1*   7/2016  Nosaka ................ H03H 9/6483
2020/0052672 A1*   2/2020  Kato ...................... H03H 9/568

FOREIGN PATENT DOCUMENTS

| JP | 2018-023174 A | 2/2018 |
| WO | 2009/025055 A1 | 2/2009 |
| WO | 2018/016279 A1 | 1/2018 |
| WO | WO 2018139320 A1 * | 8/2018 |

OTHER PUBLICATIONS

English Translation of the Written Opinion dated May 7, 2019 received for PCT Application No. PCT/JP2019/008304, 8 pages.

* cited by examiner

FIG.1
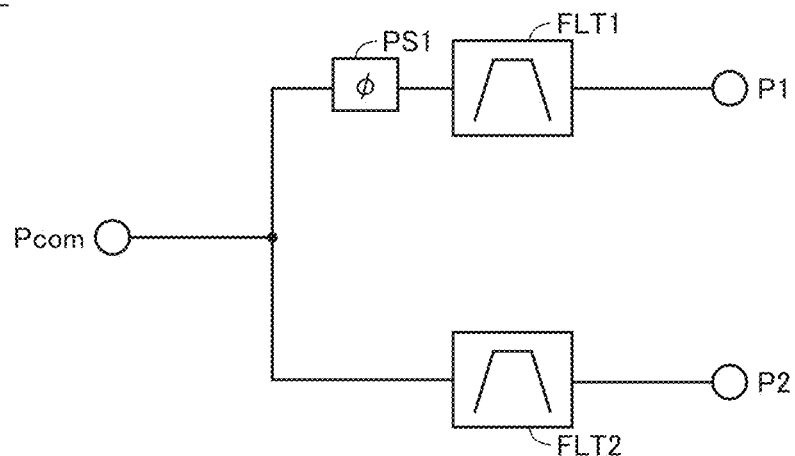
FIG.2
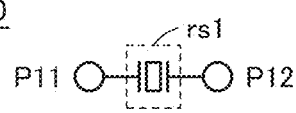
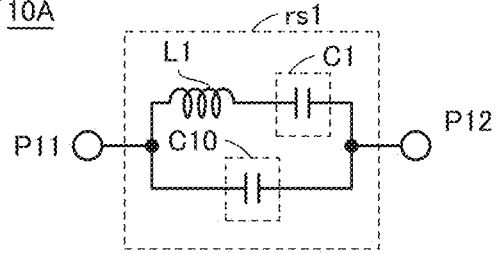

FIG.4
(a) 20
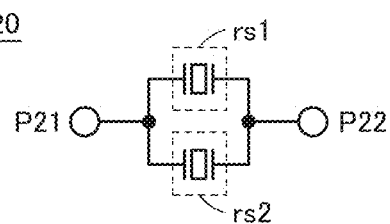
(b) 20A
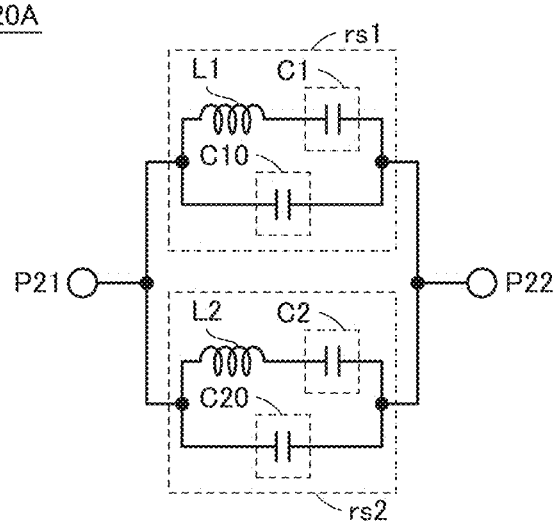
(c) 20B
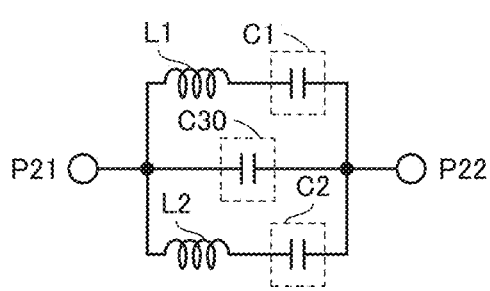

FIG.11
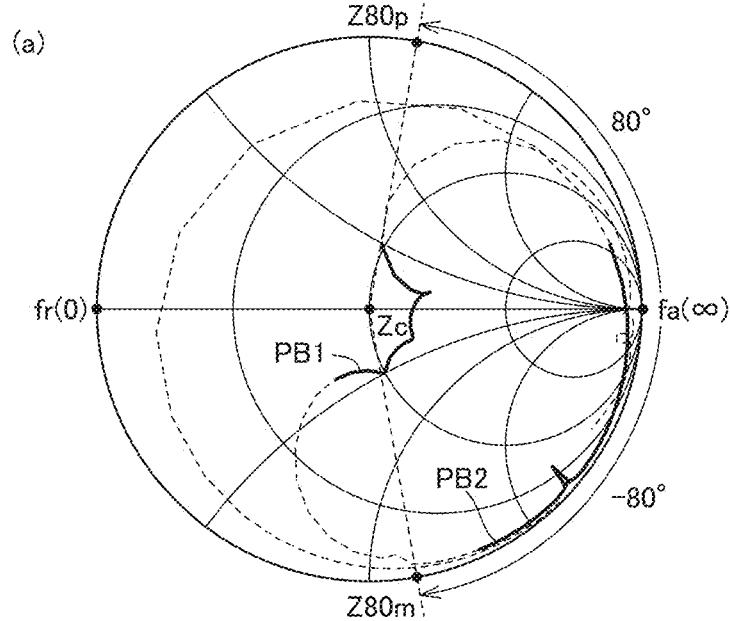
(a)
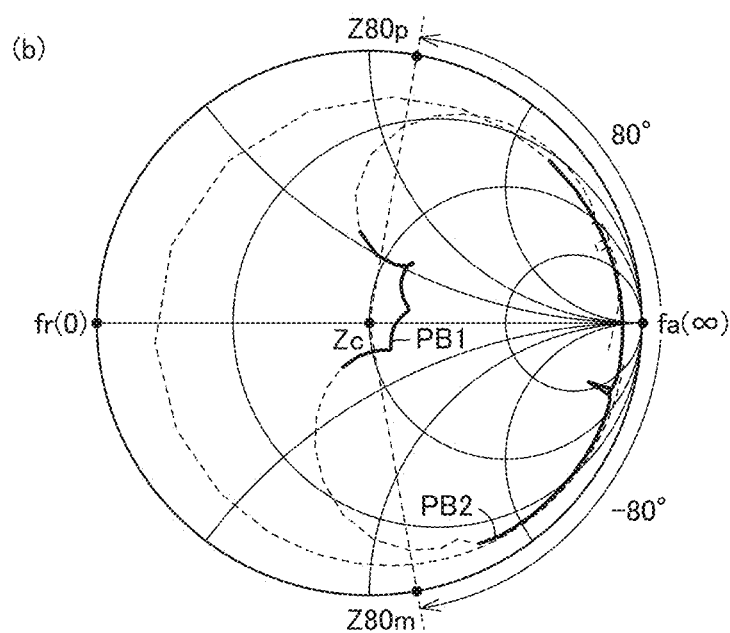
(b)

FIG.14
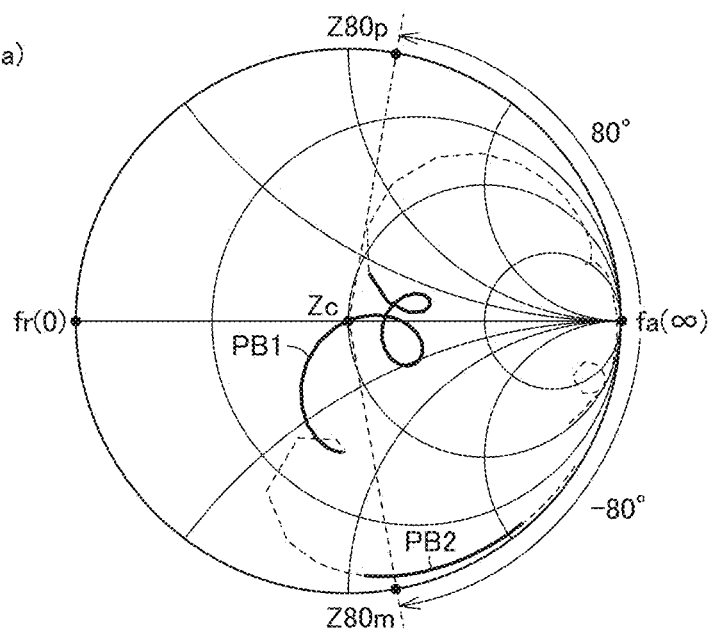
(a)
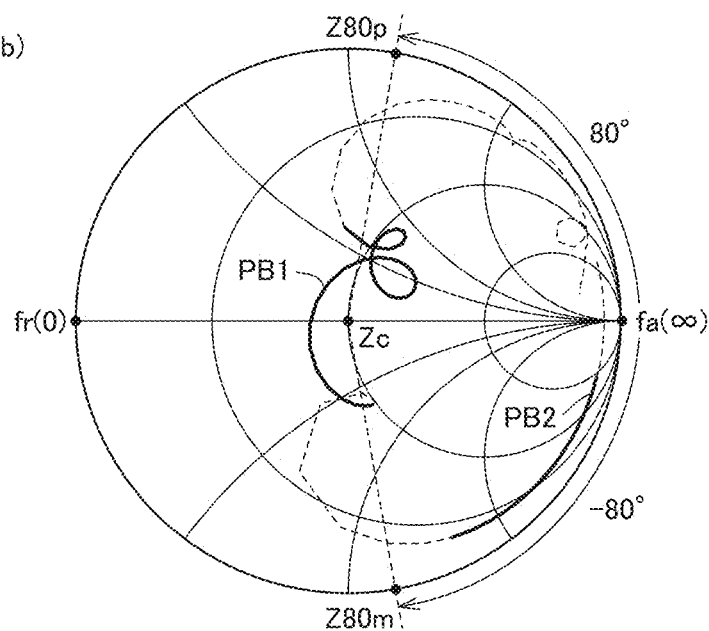
(b)

FIG.15
(a)
INSERTION LOSS, AMOUNT OF ATTENUATION (dB)
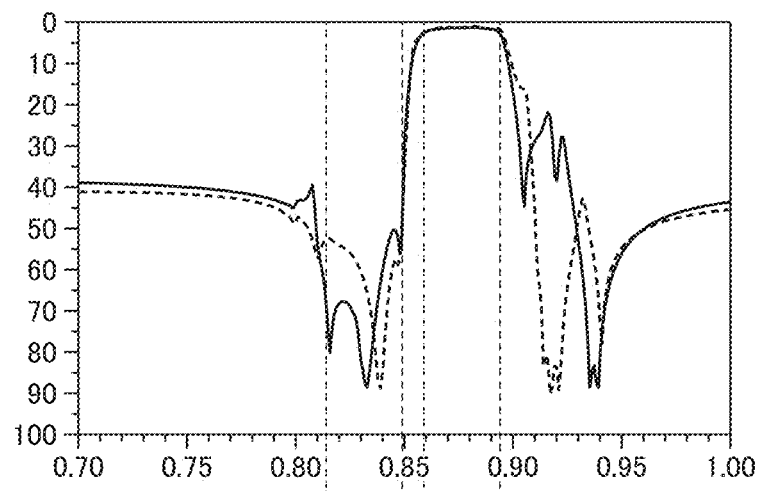
(b)
INSERTION LOSS, AMOUNT OF ATTENUATION (dB)
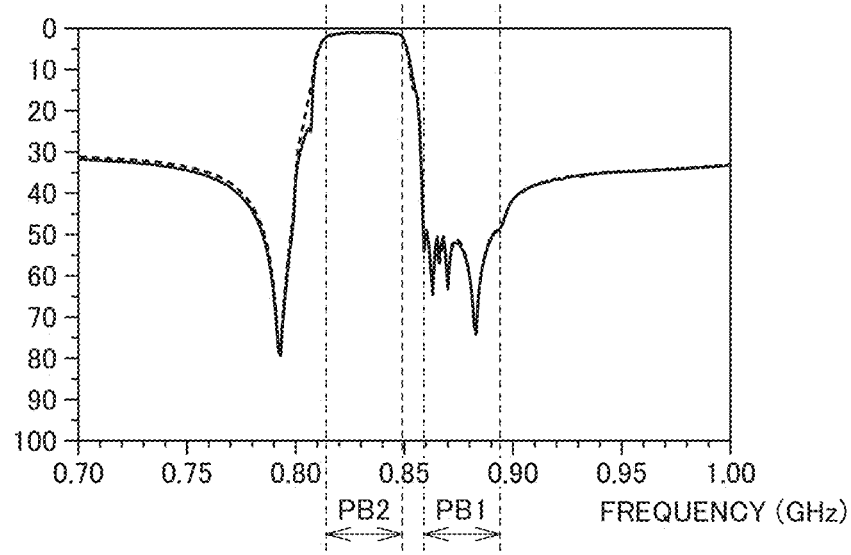

FIG.16
(a)
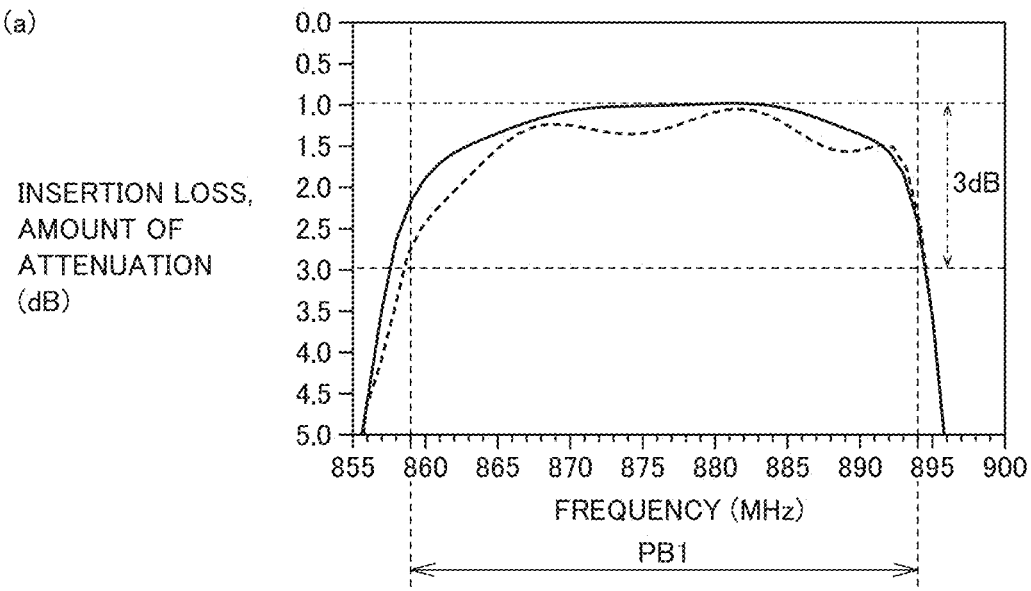
(b)
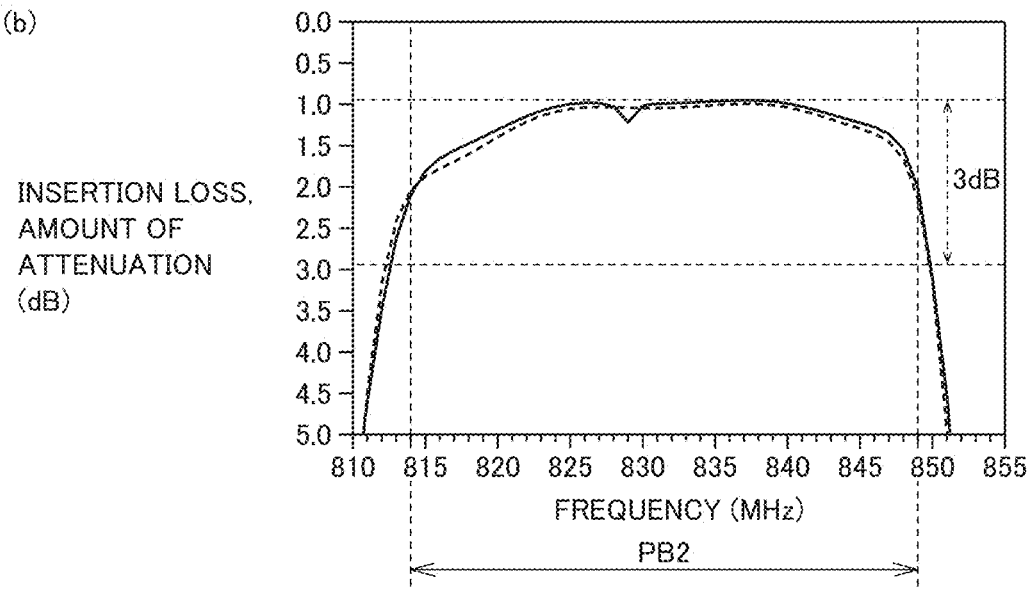

| fr (MHz) | fa (MHz) | BWR (%) |
|---|---|---|
| 1380.0 | 1437.3 | 7.91 |
| 1400.0 | 1438.3 | 7.77 |
| 1420.0 | 1439.3 | 7.63 |
| 1440.0 | 1440.3 | 7.49 |
| 1460.0 | 1441.3 | 7.35 |
| 1480.0 | 1442.3 | 7.21 |
| 1500.0 | 1443.3 | 7.07 |
| 1520.0 | 1444.3 | 6.93 |

FIG.25
(a)
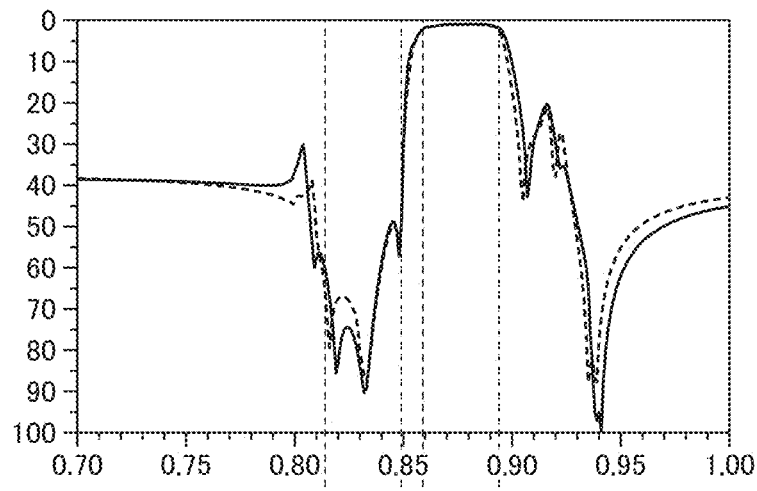
(b)
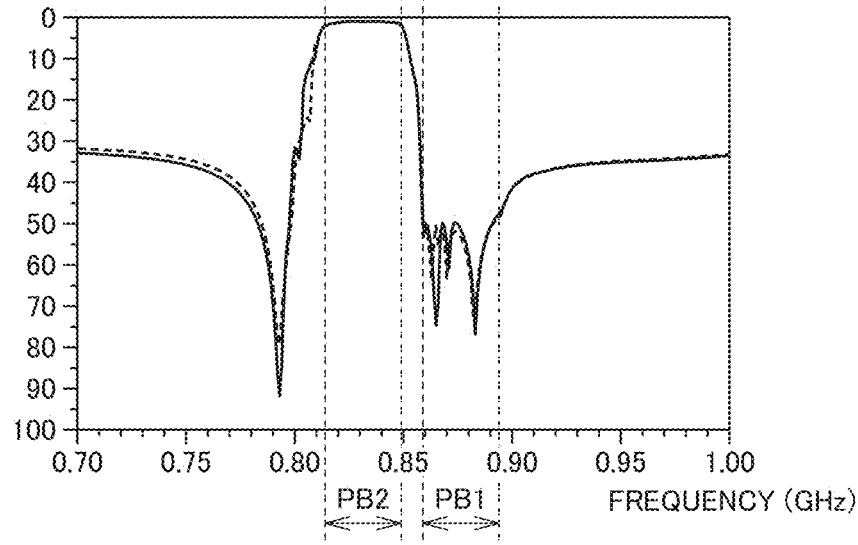

FIG.26
(a)
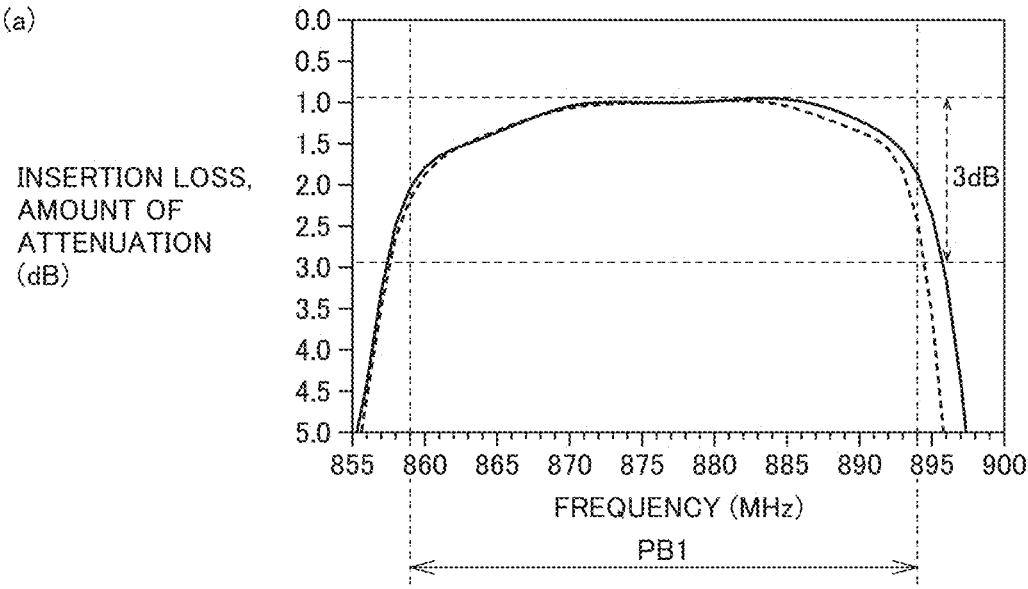
(b)
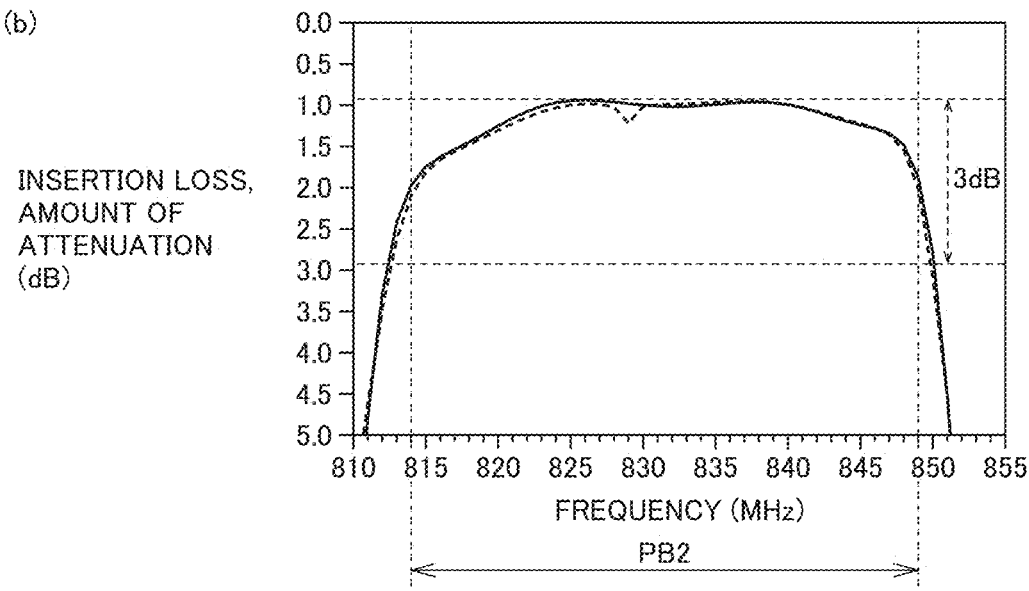

FIG.30
(a)
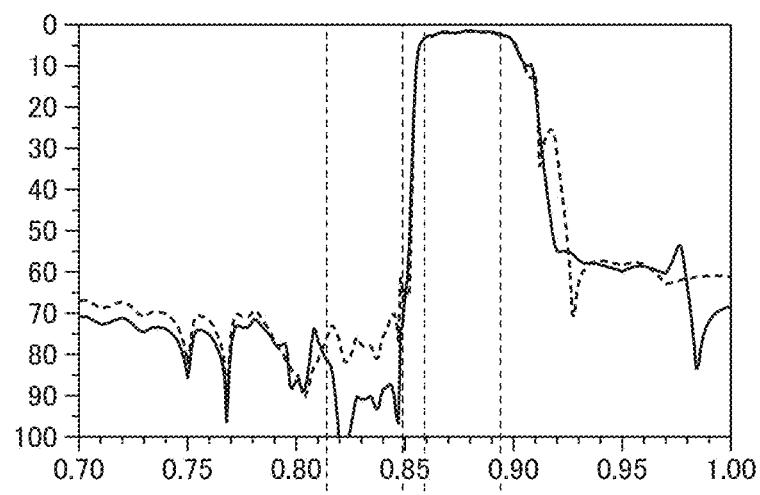
INSERTION LOSS, AMOUNT OF ATTENUATION (dB)
(b)
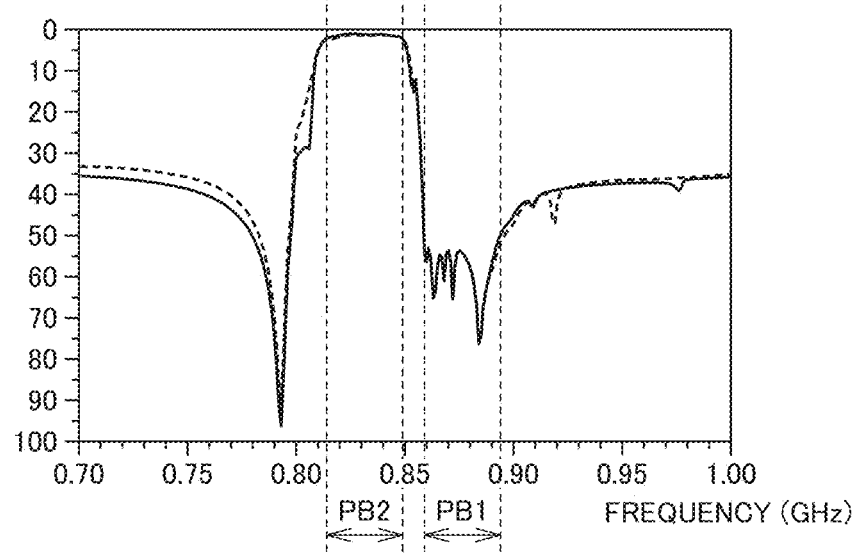
INSERTION LOSS, AMOUNT OF ATTENUATION (dB)

FIG.31
(a)
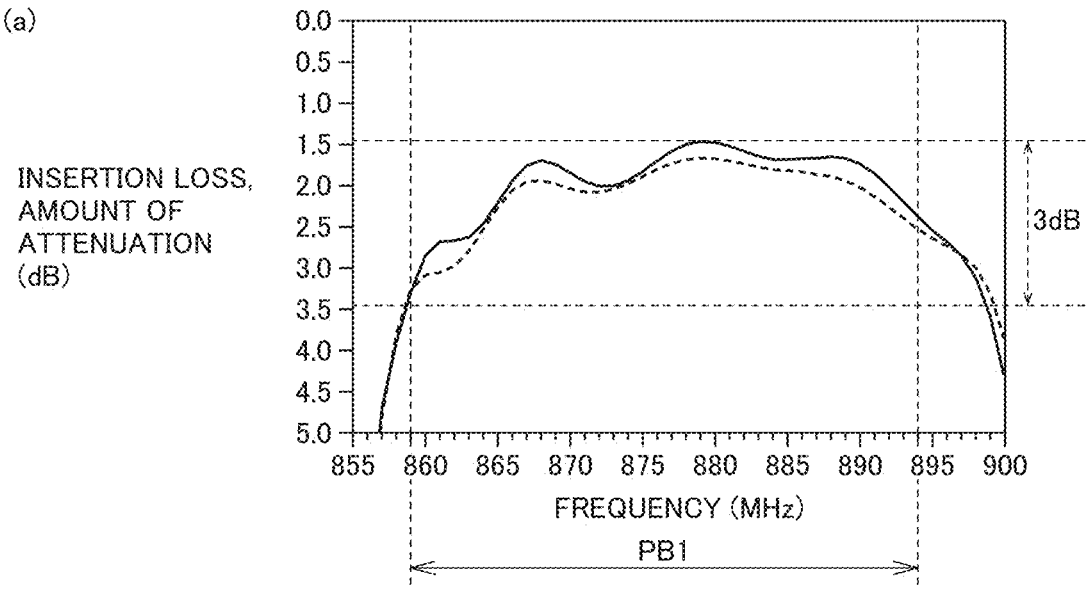
(b)
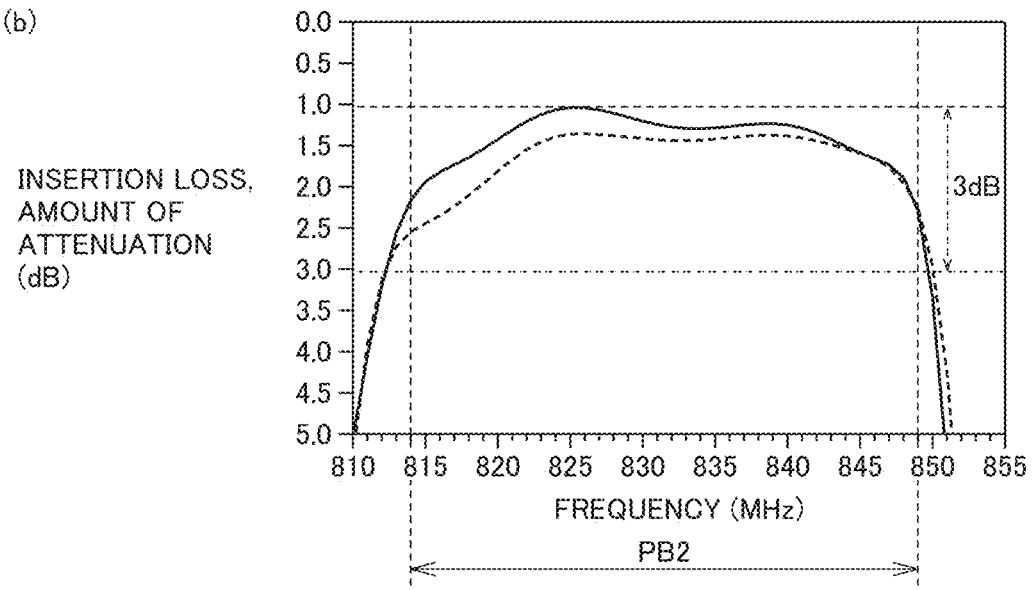

FIG.33
(a)
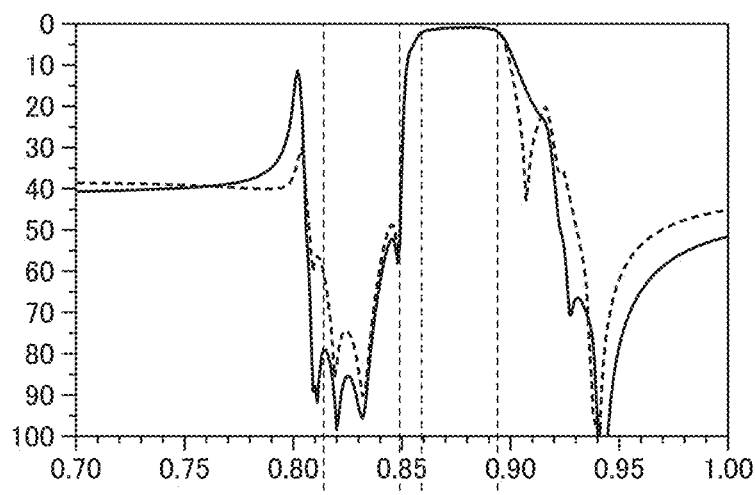
INSERTION LOSS, AMOUNT OF ATTENUATION (dB)
(b)
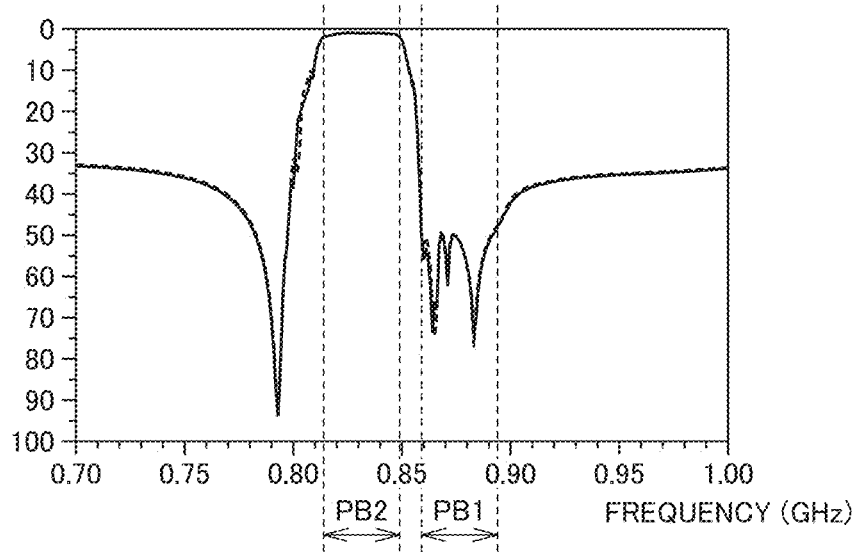
INSERTION LOSS, AMOUNT OF ATTENUATION (dB)
FREQUENCY (GHz)

FIG.34
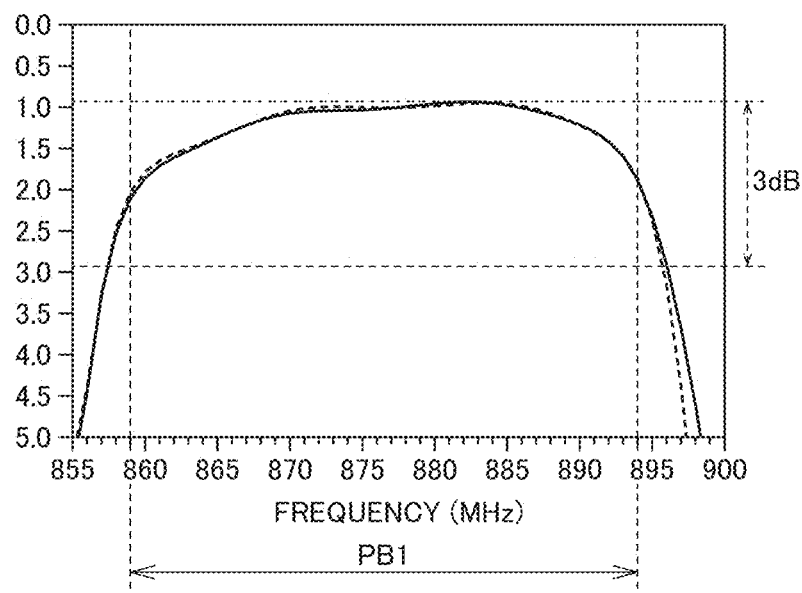
(a)
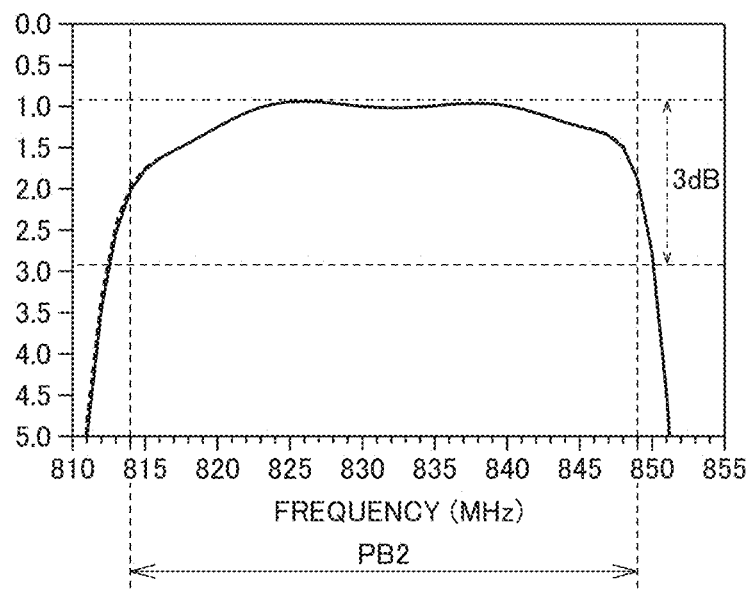
(b)

FIG.36
(a) 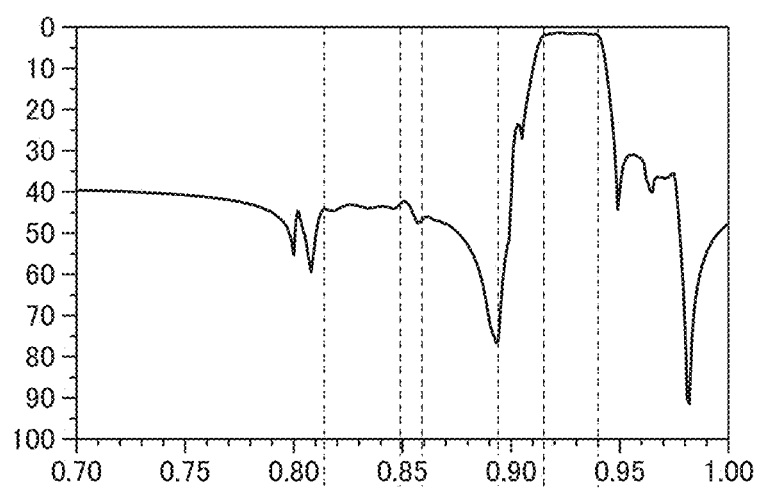
(b) 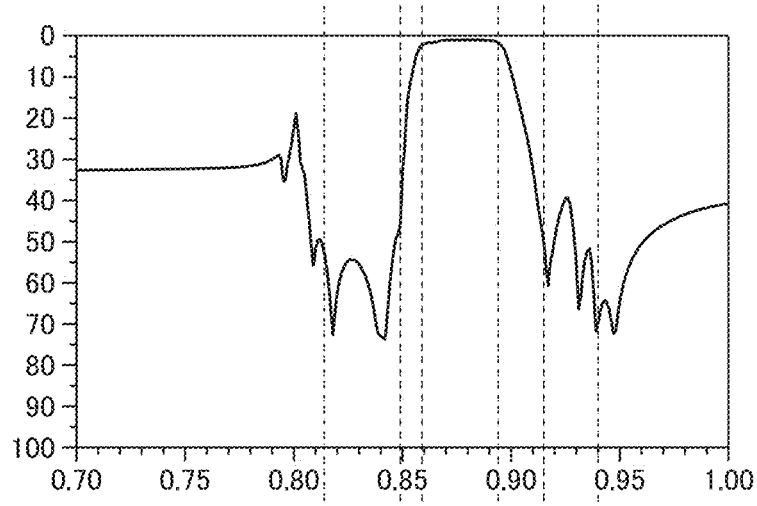
(c) 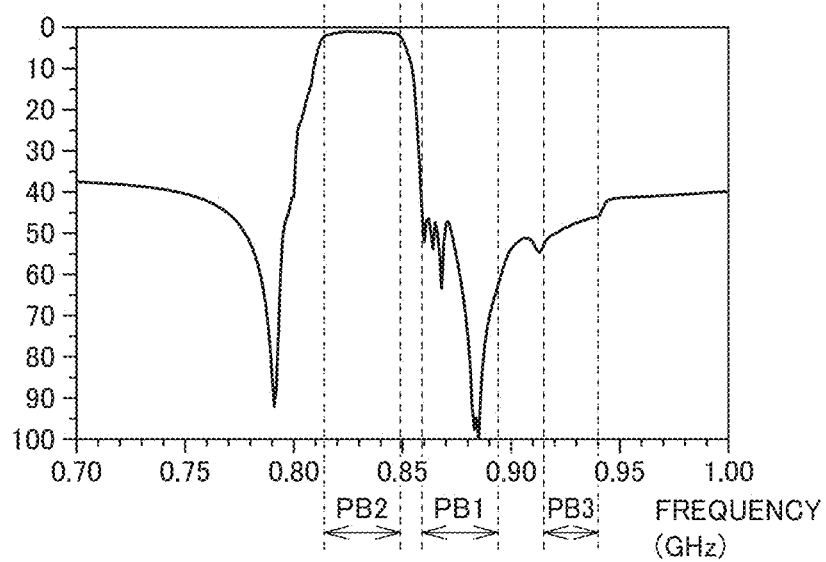

MULTIPLEXER, RADIO-FREQUENCY FRONT-END CIRCUIT, COMMUNICATION APPARATUS, AND ELASTIC WAVE FILTER

CROSS-REFERENCE TO RELATED APPLICATION

The present application is a bypass continuation of PCT filing PCT/JP2019/008304, filed Mar. 4, 2019, which claims priority to JP 2018-061588, filed Mar. 28, 2018, the entire contents of each are incorporated herein by reference.

TECHNICAL FIELD

The present disclosure relates to a multiplexer, a radio-frequency front-end circuit, a communication apparatus, and an elastic wave filter.

BACKGROUND ART

A multiplexer including a plurality of filters having respective passbands different from each other has been known. For example, WO2009/025055 (PTL 1) discloses a duplexer including a transmitter filter and a receiver filter different in passband from the transmitter filter.

In the duplexer, each of the transmitter filter and the receiver filter is configured as an elastic wave filter having a steep cut-off characteristic. Thus, even when the guard band of the transmitter filter and the receiver filter is narrowed, the transmitter filter and the receiver filter can still perform filtering. Accordingly, the frequency band of each of the transmitter filter and the receiver filter can effectively be used.

CITATION LIST

Patent Literature

PTL 1: WO2009/025055

SUMMARY

Technical Problem

In a multiplexer, in order to match the impedance of a certain filter as seen from a common terminal, a phase shifter may be disposed between the filter and the common terminal for adjusting the phase of the impedance. For example, PTL 1 discloses a duplexer including a phase shifter connected between an antenna port and a receiver filter.

When a signal in the passband of the receiver filter is input to the antenna port, a loss is generated when the signal is passed through the phase shifter. An insertion loss of the multiplexer in the passband of the receiver filter includes a non-negligible loss at the phase shifter. The inclusion of the phase shifter could increase the insertion loss of the multiplexer in the passband of the receiver filter.

The present disclosure has been made to solve the problem as described above, and an object thereof is to reduce the insertion loss of the multiplexer.

Solution to Problem

A multiplexer according to one embodiment of the present disclosure includes a common terminal, a first terminal and a second terminal, a first filter, and a second filter. The first filter is located between the common terminal and the first terminal and passes a signal in a first passband. The second filter is located between the common terminal and the second terminal and passes a signal in a second passband. The second passband is lower than the first passband and does not overlap the first passband. The first filter includes a first series arm circuit. The first series arm circuit includes a first series arm resonator and a second series arm resonator. The first series arm circuit is connected to the common terminal not through a circuit including an elastic wave resonator and a connecting point of the circuit. The first series arm circuit has a first antiresonance frequency and a second antiresonance frequency higher than the first antiresonance frequency. The second antiresonance frequency is higher than a higher edge of the first passband. The first antiresonance frequency is at or lower than a higher edge of the second passband.

An elastic wave filter according to another embodiment of the present disclosure includes a first terminal, a second terminal, and a series arm circuit. The series arm circuit is connected between the first terminal and the second terminal. The series arm circuit is connected to the first terminal not through a circuit including an elastic wave resonator and a connecting point of the circuit. The series arm circuit includes a first series arm resonator and a second series arm resonator. The series arm circuit has a first antiresonance frequency and a second antiresonance frequency higher than the first antiresonance frequency. The second antiresonance frequency is higher than a higher edge of a passband of the elastic wave filter. The first antiresonance frequency is lower than a lower edge of the passband. The elastic wave filter further includes an elastic wave resonator included in a circuit different from the series arm circuit. A fractional bandwidth of the first series arm resonator is larger than a fractional bandwidth of the elastic wave resonator, where a fractional bandwidth of a resonator is a value determined by dividing a difference between an antiresonance frequency and a resonance frequency of the resonator by the resonance frequency.

Advantageous Effects

With the multiplexer according to one embodiment of the present disclosure, the insertion loss of the multiplexer can be reduced, by setting the first antiresonance frequency at or lower than the higher edge of the second passband. Moreover, with an elastic wave filter according to another embodiment of the present disclosure, the insertion loss of the multiplexer can be reduced, by setting the first antiresonance frequency of the elastic wave filter at or lower than the higher edge of the second passband of the multiplexer.

BRIEF DESCRIPTION OF DRAWINGS

FIG. 1 is a circuit configuration diagram of a multiplexer according to Embodiment 1.

FIG. 2 (a) shows a circuit including an elastic wave resonator, and FIG. 2 (b) shows an equivalent circuit of the circuit in FIG. 2 (a).

FIG. 4 (a) shows a circuit including two elastic wave resonators connected in parallel, FIG. 4 (b) shows an equivalent circuit of the circuit in FIG. 4 (a), and FIG. 4 (c) shows an equivalent circuit of the equivalent circuit in FIG. 4 (b).

FIG. 11 (a) is a Smith chart showing an impedance of the circuit other than the phase shifter, as the first filter is seen from the phase shifter, and FIG. 11 (b) is a Smith chart showing an impedance as the first filter is seen from the common terminal.

FIG. 14 (a) is a Smith chart showing an impedance of the circuit other than a phase shifter, as the first filter is seen from the phase shifter, and FIG. 14 (b) is a Smith chart showing an impedance as the first filter is seen from the common terminal.

FIG. 15 shows pass characteristics of the multiplexer in FIG. 8 and pass characteristics of the multiplexer in FIG. 13.

FIG. 16 (a) shows, in an enlarged form, the pass characteristics in the range from 0 to 5 dB in the first passband in FIG. 15 (a), and FIG. 16 (b) shows, in an enlarged form, the pass characteristics in the range from 0 to 5 dB in the second passband in FIG. 15 (b).

FIG. 25 shows pass characteristics of the multiplexer in FIG. 18 and pass characteristics of the multiplexer in FIG. 8.

FIG. 26 (a) shows, in an enlarged form, the pass characteristics in the range from 0 to 5 dB in the first passband in FIG. 25 (a), and FIG. 26 (b) shows, in an enlarged form, the pass characteristics in the range from 0 to 5 dB in the second passband in FIG. 25 (b).

FIG. 30 shows pass characteristics of the multiplexer in FIG. 27 and pass characteristics of the multiplexer in FIG. 29.

FIG. 31 (a) shows, in an enlarged form, the pass characteristics in the range from 0 to 5 dB in the first passband in FIG. 30 (a), and FIG. 31 (b) shows, in an enlarged form, the pass characteristics in the range from 0 to 5 dB in the second passband in FIG. 30 (b).

FIG. 33 shows pass characteristics of the multiplexer in FIG. 32, and pass characteristics of the multiplexer in FIG. 18.

FIG. 34 (a) shows, in an enlarged form, the pass characteristics in the range from 0 to 5 dB in the first passband in FIG. 33 (a), and FIG. 34 (b) shows, in an enlarged form, the pass characteristics in the range from 0 to 5 dB in the second passband in FIG. 33 (b).

FIG. 36 shows pass characteristics of the multiplexer in FIG. 35.

DESCRIPTION OF EMBODIMENTS

Figure 3:
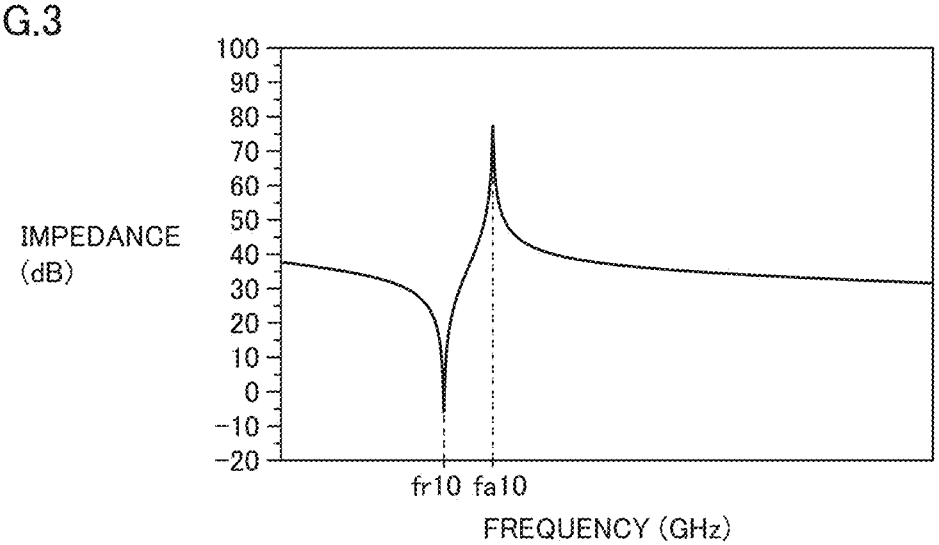
FIG. 3 is a diagram showing an impedance characteristic of the circuit in FIG. 2.

In the following, embodiments are described in detail with reference to the drawings. In the drawings, the same or corresponding parts are denoted by the same reference characters, and basically a description thereof is not repeated herein.

The passband in the embodiments refers to any continuous frequency band in which an insertion loss falls within the range from a minimum value of the insertion loss to a value determined by adding 3 dB to the minimum value.

A parallel arm circuit herein refer to a circuit disposed between the ground and an associated connecting point located on a path that connects a common terminal to an input/output terminal. A series arm circuit herein refer to a circuit connected between the common terminal and the input/output terminal, a circuit disposed between the common terminal or the input/output terminal and an associated connecting point on the path to which an associated parallel arm circuit is connected, or a circuit disposed between an associated connecting point on the path to which an associated parallel arm circuit is connected, and another associated connecting point on the path to which another associated parallel arm circuit is connected. Each of the series arm circuit and the parallel arm circuit may be formed as a single elastic wave resonator or reactance element (inductor or capacitor, for example). Each of the series arm circuit and the parallel arm circuit may be divided in series or parallel to include a plurality of elastic wave resonators.

A resonance frequency of a resonator or a circuit herein refers, unless otherwise specified, to the frequency at "a resonance point" that is a singularity point at which the impedance of the resonator or the circuit is minimum (ideally a point at which the impedance is zero).

An antiresonance frequency of a resonator or a circuit herein refers, unless otherwise specified, to the frequency at "an antiresonance point" that is a singularity point at which the impedance of the resonator or the circuit is maximum (ideally a point at which the impedance is infinite).

Embodiment 1

FIG. 1 is a circuit configuration diagram of a multiplexer 1 according to Embodiment 1. As shown in FIG. 1, multiplexer 1 includes a common terminal Pcom, an input/output terminal P1 (first terminal), an input/output terminal P2 (second terminal), a filter FLT1 (first filter), a filter FLT2 (second filter), and a phase shifter PS1. At multiplexer 1, a signal in a passband PB1 (first passband) that is input to common terminal Pcom is output from input/output terminal P1, and a signal in a passband PB2 (second passband) that is input to common terminal Pcom is output from input/output terminal P2. A signal in passband PB1 that is input from input/output terminal P1 is output from common terminal Pcom. A signal in passband PB2 that is input from input/output terminal P2 is output from common terminal Pcom.

Multiplexer 1 is a duplexer adapted for example to B26 to have B26 Rx (859 to 894 MHz) and B26 Tx (814 to 849 MHz) as passbands different from each other. In the following, passband PB1 is defined as 859 to 894 MHz and passband PB2 is defined as 814 to 849 MHz.

Phase shifter PS1 and filter FLT1 are connected in this order between common terminal Pcom and input/output terminal P1. Filter FLT1 passes a signal in passband PB1. Phase shifter PS1 increases the impedance of filter FLT1 in passband PB2 to hinder a signal in passband PB2 that is input from common terminal Pcom from being transmitted toward filter FLT1, and cause this signal to be transmitted toward filter FLT2.

Filter FLT2 is connected between input/output terminal P2 and a connecting point of common terminal Pcom and phase shifter PS1. Filter FLT2 passes a signal in passband PB2. Passband PB2 is lower than passband PB1 and does not overlap passband PB1. "One passband is lower than the other passband" herein intends to mean that the frequencies of the one passband are lower than the frequencies of the other passband.

When a signal in passband PB1 is input to common terminal Pcom, a loss is generated as the signal is passed through phase shifter PS1. The insertion loss of multiplexer 1 in passband PB1 includes a non-negligible loss at phase shifter PS1. The inclusion of phase shifter PS1 for hindering a signal in passband PB2 from being passed through filter FLT1 could increase the insertion loss of the multiplexer in passband PB1.

In view of this, in Embodiment 1, the series arm circuit included in filter FLT1 and located closest to common terminal Pcom includes two series arm resonators that are different in antiresonance frequency from each other. Of the two antiresonance frequencies of the series arm circuit, the lower antiresonance frequency (first antiresonance frequency) is set at or lower than the highest frequency (higher edge) of passband PB2 to increase the impedance of filter FLT1 in passband PB2.

Accordingly, the number of stages in the circuit that forms phase shifter PS1 can be reduced, and therefore, the insertion loss, in passband PB1, of multiplexer 1 can be reduced. In the embodiment, the series arm resonator may be constituted of one or more elastic wave resonators that are connected in series or parallel.

In the following, with reference to FIGS. 2 to 7, a description is given of impedance characteristics of a circuit including two elastic wave resonators that differ from each other in antiresonance frequency. In the description given with reference to FIGS. 2 to 7, an elastic wave resonator is regarded as an ideal device including no resistance component. First with reference to FIGS. 2 and 3, impedance characteristics of a single elastic wave resonator are described.

FIG. 2 (a) shows a circuit 10 including an elastic wave resonator rs1, and FIG. 2 (b) shows an equivalent circuit 10A of circuit 10. As shown in FIG. 2 (a), elastic wave resonator rs1 is connected between input/output terminals P11 and P12.

As shown in FIG. 2 (b), elastic wave resonator rs1 in FIG. 2 (a) is represented as an equivalent circuit including an inductor L1 and capacitors C1, C10. Capacitor C10 is a capacitance of elastic wave resonator rs1. Inductor L1 and capacitor C1 are connected in series in this order between input/output terminals P11 and P12. Capacitor C10 is connected between input/output terminals P11 and P12, in parallel with series-connected inductor L1 and capacitor C1.

The impedance of circuit 10 is minimum at resonance frequency fr10 of elastic wave resonator rs1. In FIG. 2 (b), the frequency at which the impedance of equivalent circuit 10A is minimum is the resonance frequency of the series resonance circuit formed by inductor L1 and capacitor C1. Thus, resonance frequency fr10 of elastic wave resonator rs1 is expressed by the following formula (1).

$$fr_{10} = \frac{1}{2\pi\sqrt{L_1 C_1}} \quad (1)$$

The impedance of circuit 10 is maximum at antiresonance frequency fa10 of elastic wave resonator rs1. In FIG. 2 (b), the frequency at which the impedance of equivalent circuit 10A is maximum is the resonance frequency of the parallel resonance circuit formed by series-connected inductor L1 and capacitor C1, and capacitor C10. Thus, antiresonance frequency fa10 of circuit 10 is expressed by the following formula (2).

$$fa_{10} = fr_{10}\sqrt{1 + \frac{C_1}{C_{10}}} \quad (2)$$

FIG. 3 is a diagram showing an impedance characteristic of circuit 10 in FIG. 2. As shown in FIG. 3, the impedance of circuit 10 is minimum at frequency fr10 and maximum at antiresonance frequency fa10 (>fr10).

Figure 5:
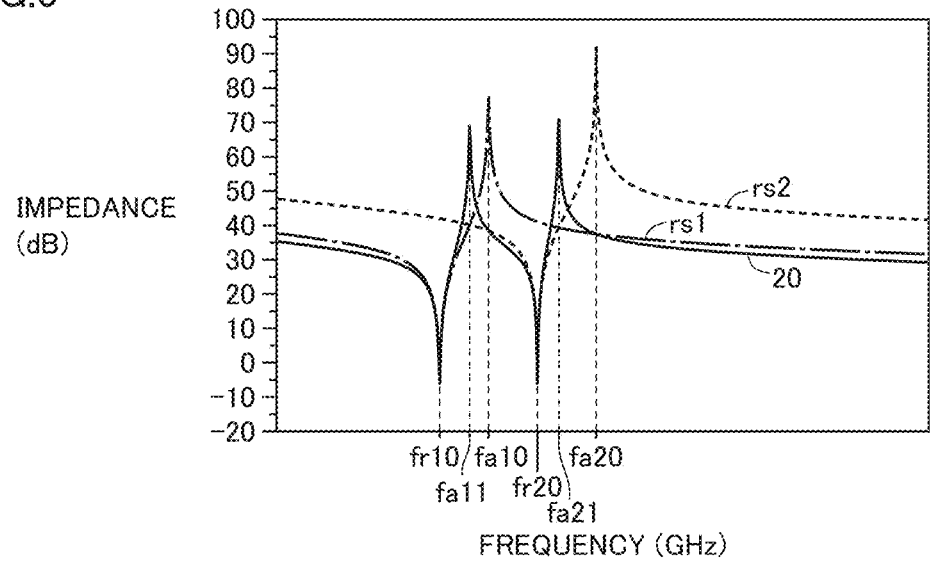
FIG. 5 is a diagram showing respective impedance characteristics of the two elastic wave resonators and an impedance characteristic of the circuit in FIG. 4.

Referring next to FIGS. 4 and 5, impedance characteristics of a circuit in which two elastic wave resonators are connected in parallel are described. FIG. 4 (a) shows a circuit 20 including two elastic wave resonators connected in parallel, FIG. 4 (b) shows an equivalent circuit 20A of circuit 20, and FIG. 4 (c) shows an equivalent circuit 20B of equivalent circuit 20A. As shown in FIG. 4 (a), elastic wave resonators rs1, rs2 are connected in parallel between input/output terminals P21 and P22. Because elastic wave resonator rs1 is identical to elastic wave resonator rs1 in FIG. 2, the description thereof is not repeated herein. Elastic wave resonator rs2 has a resonance frequency fr20 and an antiresonance frequency fa20. Resonance frequency fr20 is higher than resonance frequency fr10. Antiresonance frequency fa20 is higher than antiresonance frequency fa10.

As shown in FIG. 4 (b), elastic wave resonator rs2 in FIG. 4 (a) is represented as an equivalent circuit including an inductor L2 and capacitors C2, C20. Capacitor C20 is a capacitance of elastic wave resonator rs2. Inductor L2 and capacitor C2 are connected in series in this order between input/output terminals P21 and P22. Capacitor C20 is connected between input/output terminals P21 and P22, in parallel with series-connected inductor L2 and capacitor C2. In FIG. 4 (c), capacitors C10, C20 connected in parallel between input/output terminals P21 and P22 in FIG. 4 (b) are represented as a single capacitor C30 (C10+C20) connected between input/output terminals P21 and P22.

As elastic wave resonators rs1 and rs2 are connected in parallel, the impedance of circuit 20 is minimum at resonance frequency fr10 of elastic wave resonator rs1 and resonance frequency fr20 of elastic wave resonator rs2. In FIG. 4 (b), the frequency at which the impedance of equivalent circuit 20A is minimum is the resonance frequency of the series resonance circuit formed by inductor L1 and capacitor C1 and the resonance frequency of the series resonance circuit formed by inductor L2 and capacitor C2. In other words, circuit 20 has two resonance frequencies that are resonance frequencies fr10 and fr20.

In FIG. 4 (c), the frequency at which the impedance of equivalent circuit 20B is maximum is the resonance frequency of the parallel resonance circuit formed by series-connected inductor L1 and capacitor C1, and capacitor C30, and the resonance frequency of the parallel resonance circuit formed by series-connected inductor L2 and capacitor C2, and capacitor C30. In other words, circuit 20 has two antiresonance frequencies that differ from antiresonance frequencies fa10, fa20.

FIG. 5 is a diagram showing respective impedance characteristics of two elastic wave resonators rs1, rs2 and an impedance characteristic of circuit 20. As shown in FIG. 5, the impedance of circuit 20 is minimum at resonance frequencies fr10 and fr20 (>fr10) and maximum at antiresonance frequencies fa11 and fa21 (>fa11).

Antiresonance frequency fa11 of circuit 20 is higher than resonance frequency fr10 of elastic wave resonator rs1 and lower than antiresonance frequency fa10 thereof. Antiresonance frequency fa21 of circuit 20 is higher than resonance frequency fr20 of elastic wave resonator rs2 and lower than antiresonance frequency fa20 thereof.

Figure 6:
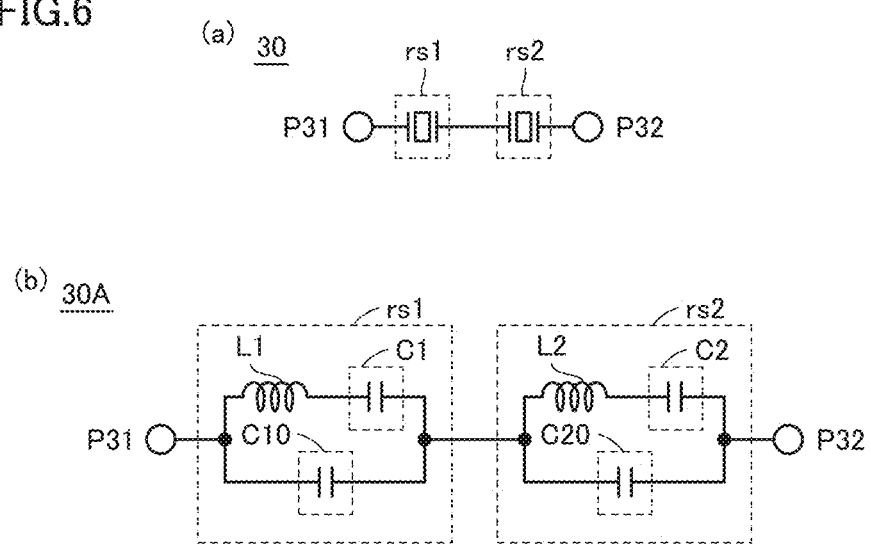
FIG. 6 (a) shows a circuit including elastic wave resonators connected in series, and FIG. 6 (b) shows an equivalent circuit of the circuit in FIG. 6 (a).
Figure 7:
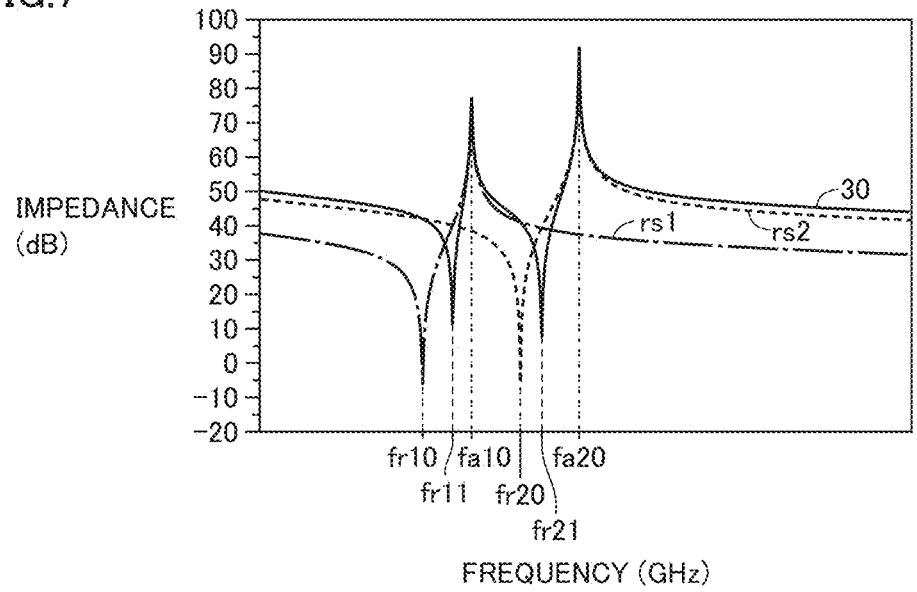
FIG. 7 is a diagram showing respective impedance characteristics of the two elastic wave resonators and an impedance characteristic of the circuit in FIG. 6.

Referring next to FIGS. 6 and 7, an impedance characteristic of a circuit in which two elastic wave resonators are connected in series is described. FIG. 6 (a) shows a circuit 30 including two elastic wave resonators connected in series, and FIG. 6 (b) shows an equivalent circuit 30A of circuit 30. As shown in FIG. 6, elastic wave resonators rs1, rs2 are connected in series between input/output terminals P31 and P32. Because elastic wave resonators rs1, rs2 are identical to elastic wave resonators rs1, rs2 in FIGS. 1 and 2, the description thereof is not repeated herein.

As elastic wave resonators rs1, rs2 are connected in series, the impedance of circuit 30 is maximum at antiresonance frequency fa10 of elastic wave resonator rs1 and antiresonance frequency fa20 of elastic wave resonator rs2. In FIG. 6 (b), the frequency at which the impedance of equivalent circuit 30A is maximum is the resonance frequency of a parallel resonance circuit formed by series-connected inductor L1 and capacitor C1, and capacitor C10, and the resonance frequency of a parallel resonance circuit formed by series-connected inductor L2 and capacitor C2, and capacitor C20. In other words, circuit 30 has two antiresonance frequencies that are antiresonance frequencies fa10 and fa20. Circuit 30 has two resonance frequencies that differ from resonance frequencies fr10, fr20.

FIG. 7 is a diagram showing respective impedance characteristics of two elastic wave resonators rs1, rs2, and an impedance characteristic of circuit 30. As shown in FIG. 7, the impedance of circuit 30 is minimum at resonance frequencies fr11 and fr20 (>fr11) and maximum at antiresonance frequencies fa10 and fa20. Resonance frequency fr11 of circuit 30 is higher than resonance frequency fr10 of elastic wave resonator rs1 and lower than antiresonance frequency fa10 thereof. Resonance frequency fr21 of circuit 30 is higher than resonance frequency fr20 of elastic wave resonator rs2 and lower than antiresonance frequency fa20 thereof.

As seen from FIGS. 5 and 7, respective impedance characteristics of the circuit having two elastic wave resonators connected in series and the circuit having two elastic wave resonators connected in parallel exhibit similar behaviors in that each circuit has the first resonance frequency, the first antiresonance frequency, the second resonance frequency, and the second antiresonance frequency. In other words, the series arm circuit provides similar functions and advantageous effects, regardless of whether the series arm circuit includes two series-connected elastic wave resonators or includes two parallel-connected elastic wave resonators. Then, in connection with Embodiment 1, a description is given of the series arm circuit including two parallel-connected elastic wave resonators. The same applies as well to Embodiment 2 and the following embodiments.

Figure 8:
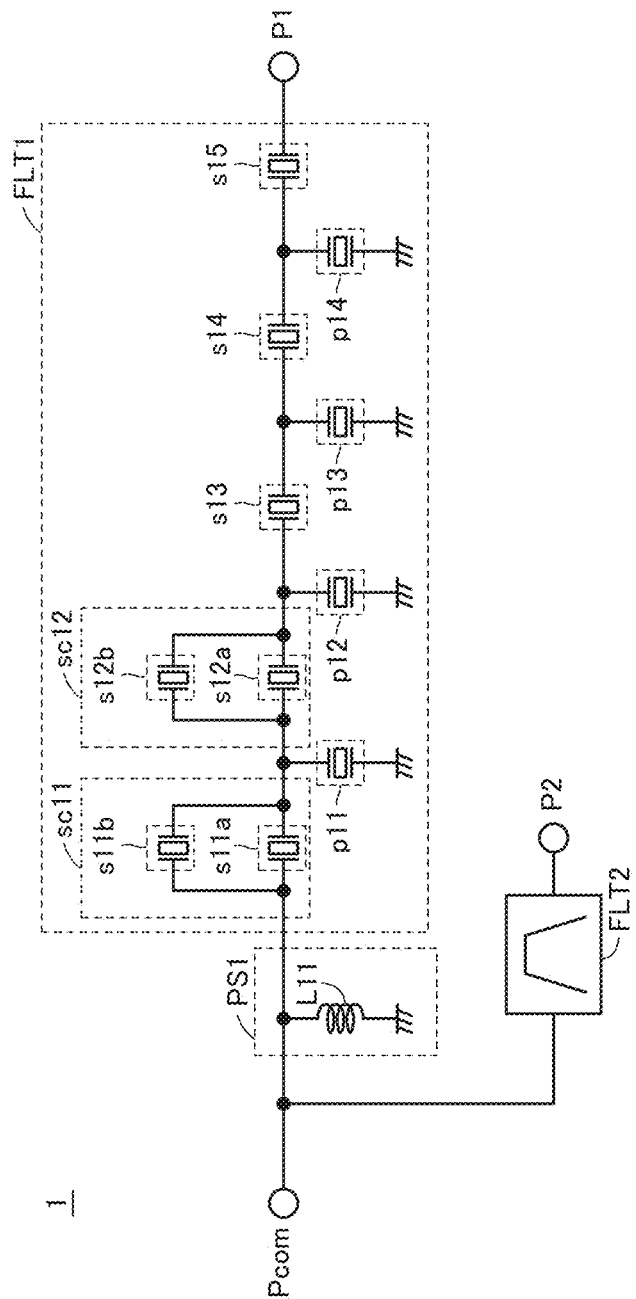
FIG. 8 shows a specific configuration of a phase shifter and a first filter of the multiplexer in FIG. 1.

FIG. 8 shows a specific configuration of phase shifter PS1 and filter FLT1 of multiplexer 1 in FIG. 1. As shown in FIG. 8, phase shifter PS1 includes an inductor L11. Inductor L11 is connected between the ground and a connecting point of common terminal Pcom and filter FLT1.

Filter FLT1 includes a series arm circuit sc11 (first series arm circuit), a series arm circuit sc12 (second series arm circuit), series arm resonators s13 to s15, and parallel arm resonators p11 to p14. Series arm circuit sc11, series arm circuit sc12, and series arm resonators s13 to s15 are series-connected in this order between phase shifter PS1 and input/output terminal P1. A signal in passband PB1 that is input from the common terminal is input to series arm circuit sc11 without being passed through a circuit including an elastic wave resonator(s).

Series arm circuit sc11 includes a series arm resonator s11a (first series arm resonator) and a series arm resonator s11b (second series arm resonator). Series arm resonators s11a, s11b are connected in parallel between phase shifter PS1 and series arm circuit sc12. Series arm circuit sc12 includes series arm resonators s12a, s12b. Series arm resonators s12a, s12b are connected in parallel between series arm circuit sc11 and series arm resonator s13.

Parallel arm resonator p11 is connected between the ground and a connecting point between series arm circuits sc11 and sc12. Parallel arm resonator p12 is connected between the ground and a connecting point between series arm circuit sc12 and series arm resonator s13. Parallel arm resonator p13 is connected between the ground and a connecting point between series arm resonators s13 and s14. Parallel arm resonator p14 is connected between the ground and a connecting point between series arm resonators s14 and s15.

Table 1 below shows the resonance frequency (fr), the antiresonance frequency (fa), and the fractional bandwidth (BWR) of each of series arm resonators s11a, s11b, s12a, s12b, s13 to s15 and parallel arm resonators p11 to p14, and shows the first resonance frequency (fr1), the first antiresonance frequency (fa1), the second resonance frequency (fr2), and the second antiresonance frequency (fa2) of each of series arm circuits sc11, sc12 in Embodiment 1. Fractional bandwidth BWR refers to a value determined by dividing, by resonance frequency fr, the difference between antiresonance frequency fa and resonance frequency fr ((fa−fr)/fr) and represented in percentage.

TABLE 1

| Series Arm Resonator | s11a | s11b | s12a | s12b | s13 | s14 | s15 |
|---|---|---|---|---|---|---|---|
| fr [MHz] | 801.6 | 881.8 | 827.5 | 875.2 | 889.2 | 892.7 | 858.7 |
| fa [MHz] | 847.2 | 927.7 | 873.3 | 921.1 | 935.1 | 938.6 | 904.6 |
| BWR [%] | 5.69 | 5.21 | 5.54 | 5.25 | 5.16 | 5.14 | 5.35 |
| Series Arm Circuit | sc11 | | sc12 | | | | |
| fr1 [MHz] | 801.6 | | 827.5 | | | | |
| fa1 [MHz] | 815.8 | | 829.3 | | | | |
| fr2 [MHz] | 881.8 | | 875.2 | | | | |
| fa2 [MHz] | 913.7 | | 919.5 | | | | |
| Parallel Arm Resonator | p11 | p12 | p13 | p14 | | | |
| fr [MHz] | 849.2 | 848.3 | 833.2 | 832.7 | | | |
| fa [MHz] | 895.1 | 894.2 | 879.0 | 878.5 | | | |
| BWR [%] | 5.40 | 5.41 | 5.50 | 5.50 | | | |

Filter FLT2 may include an elastic wave resonator or an LC resonance circuit. The elastic wave resonator is, for example, a surface acoustic wave (SAW) resonator, a bulk acoustic wave (BAW) resonator, a film bulk acoustic wave resonator (FBAR), or a solidly mounted (SM) resonator.

Figure 9:
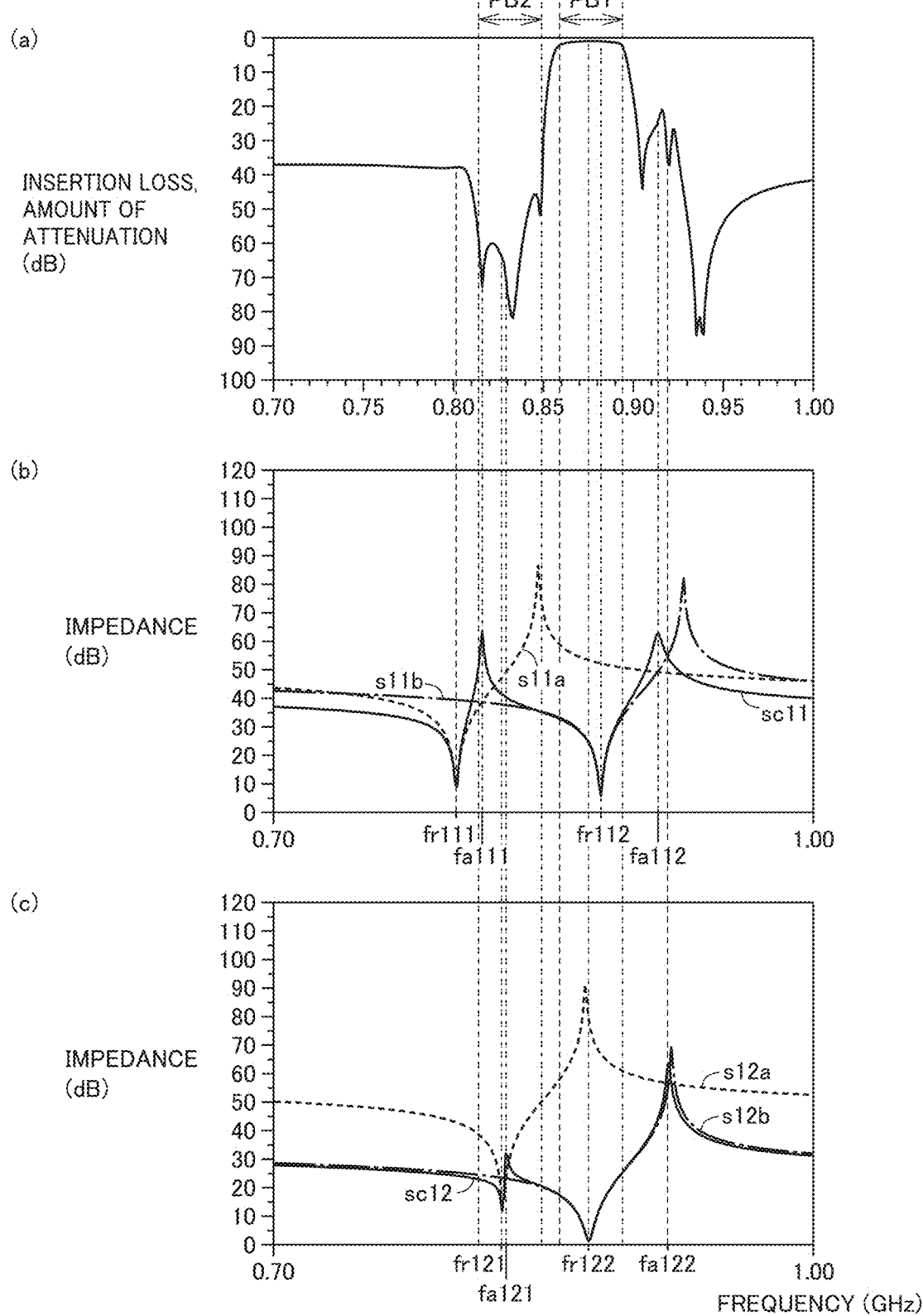
FIG. 9 (a) shows a pass characteristic of the first filter, FIG. 9 (b) shows an impedance characteristic of a first series arm circuit, and FIG. 9 (c) shows an impedance characteristic of a second series arm circuit.

FIG. 9 (a) shows a pass characteristic of filter FLT1 (a frequency characteristic of an insertion loss and an amount of attenuation) of filter FLT1, FIG. 9 (b) shows an impedance characteristic of series arm circuit sc11, and FIG. 9 (c) shows an impedance characteristic of series arm circuit sc12. FIG. 9 (b) also shows respective impedance characteristics of series arm resonators s11a, s11b. FIG. 9 (c) also shows respective impedance characteristics of series arm resonators s12a, s12b. "Pass characteristic of a filter" herein refers to a pass characteristic of the filter alone, i.e., a pass characteristic of the filter separated from other circuits.

As shown in FIG. 9 (b), series arm circuit sc11 has a resonance frequency fr111 (first resonance frequency), an antiresonance frequency fa111 (first antiresonance frequency), a resonance frequency fr112 (second resonance frequency), and an antiresonance frequency fa112 (second antiresonance frequency). Antiresonance frequency fa111 is higher than resonance frequency fr111. Resonance frequency fr112 is higher than antiresonance frequency fa111. Antiresonance frequency fa112 is higher than resonance frequency fr112.

Antiresonance frequency fa111 is included in passband PB2 to form an attenuation pole and increase the impedance of filter FLT1 in passband PB2, so that passage, through filter FLT1, of a signal in passband PB2 is hindered. Antiresonance frequency fa112 is higher than the higher edge of passband PB1 to form an attenuation pole and increase the impedance of filter FLT1 in a frequency band higher than passband PB1, so that passage, through filter FLT1, of a signal in a frequency band higher than passband PB1 is hindered. Resonance frequency fr112 is included in passband PB1 to reduce the impedance of filter FLT1 in passband PB1, so that passage, through filter FLT1, of a signal in passband PB1 is facilitated.

As shown in FIG. 9 (c), series arm circuit sc12 has a resonance frequency fr121, an antiresonance frequency fa121 (>fr121), a resonance frequency fr122 (>fa121), and an antiresonance frequency fa122 (>fr122). Antiresonance frequency fa121 is included in passband PB2 to form an attenuation pole and increase the impedance of filter FLT1 in passband PB2, so that passage, through filter FLT1, of a signal in passband PB2 is hindered. Antiresonance frequency fa122 is higher than the higher edge of passband PB1, to form an attenuation pole and increase the impedance of filter FLT1 in a frequency band higher than passband PB1, so that passage, through filter FLT1, of a signal in a frequency band higher than passband PB1 is hindered. Resonance frequency fr122 is included in passband PB1 to reduce the impedance of filter FLT1 in passband PB1, so that passage, through filter FLT1, of a signal in passband PB1 is facilitated.

Figure 10:
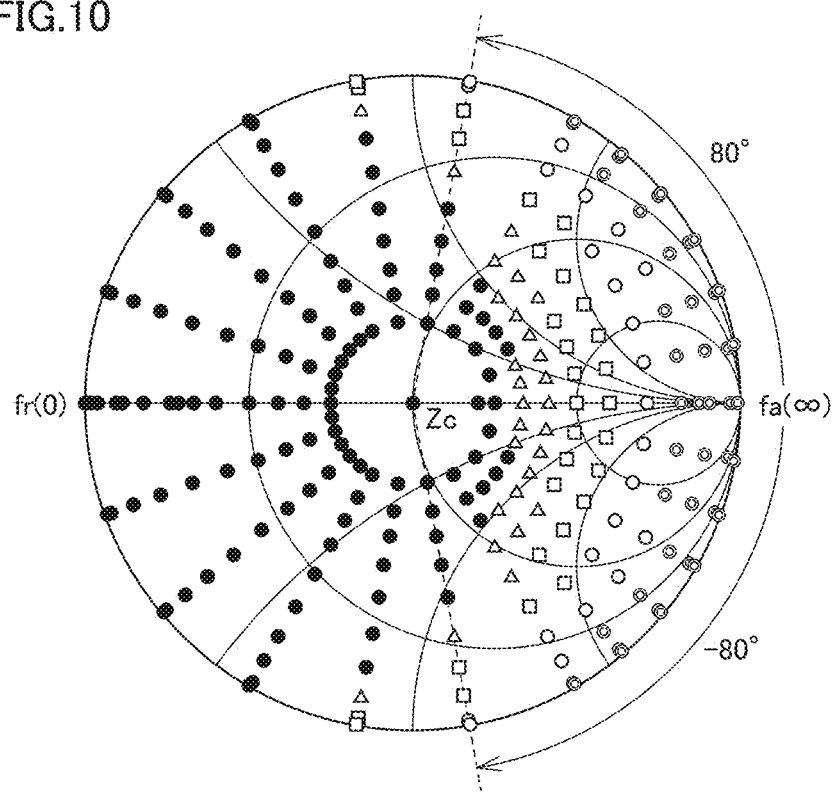
FIG. 10 is a Smith chart showing a relation between an insertion loss and an impedance in a second passband as the first filter is seen from a common terminal.

FIG. 10 is a Smith chart showing a relation between an insertion loss of filter FLT2 and an impedance in passband PB2 as phase shifter PS1 and filter FLT1 are seen from common terminal Pcom. Specifically, the impedance in passband PB2 as phase shifter PS1 and filter FLT1 are seen from common terminal Pcom is converted to points (marks) shown in FIG. 10 each representing a magnitude of the insertion loss, in passband PB2, of filter FLT2. In FIG. 10, the double circle mark represents an insertion loss of 0.5 dB or less. The single circle mark represents an insertion loss of more than 0.5 dB and less than or equal to 1 dB. The square mark represents an insertion loss of more than 1 dB and less than or equal to 1.5 dB. The triangular mark represents an insertion loss of more than 1.5 dB and less than or equal to 2 dB. The solid circle mark represents an insertion loss of more than 2 dB.

As shown in FIG. 10, the phase where the insertion loss of filter FLT2 is 0.5 dB or less extends from −80 degrees to 80 degrees. The phase refers to a phase with respect to the line connecting the center point Zc (normalized impedance) of the Smith chart and a point fa thereof at which the impedance is infinite, and the phase extending from this line in the anticlockwise direction is positive. In order to reduce the insertion loss of filter FLT2, the phase in passband PB2 as phase shifter PS1 and filter FLT1 are seen from common terminal Pcom is desirably included in the range from −80 degrees to 80 degrees.

FIG. 11 (a) is a Smith chart showing an impedance of the circuit other than phase shifter PS1 as filter FLT1 is seen from phase shifter PS1, and FIG. 11 (b) is a Smith chart showing an impedance as filter FLT1 is seen from common terminal Pcom. As shown in FIG. 11 (a), the impedance, in passband PB1, of filter FLT1 itself is matched and therefore located around normalized impedance Zc. The phase in passband PB2 ranges from −65 degrees to 15 degrees, and is included in the range from −80 degrees to 80 degrees. As shown in FIG. 11 (b), the phase in passband PB2 is slid anticlockwise by phase shifter PS1, so that the phase ranges from −60 degrees to 40 degrees and is included in the range from −80 degrees to 80 degrees and located closer to zero degree that is the phase where the impedance is infinite.

Figure 12:
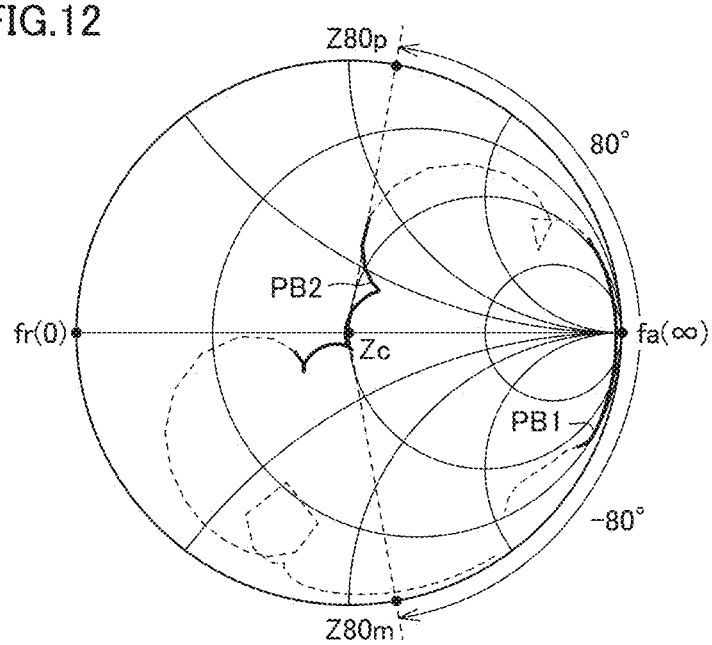
FIG. 12 is a Smith chart showing an impedance as a second filter is seen from the common terminal.

FIG. 12 is a Smith chart showing an impedance as filter FLT2 is seen from common terminal Pcom. As shown in FIG. 12, the impedance, in passband PB2, of filter FLT2 itself is matched with normalized impedance Zc and therefore distributed around normalized impedance Zc. The phase in passband PB1 ranges from −25 degrees to 20 degrees, and is included in the range from −80 degrees to 80 degrees.

Figure 13:
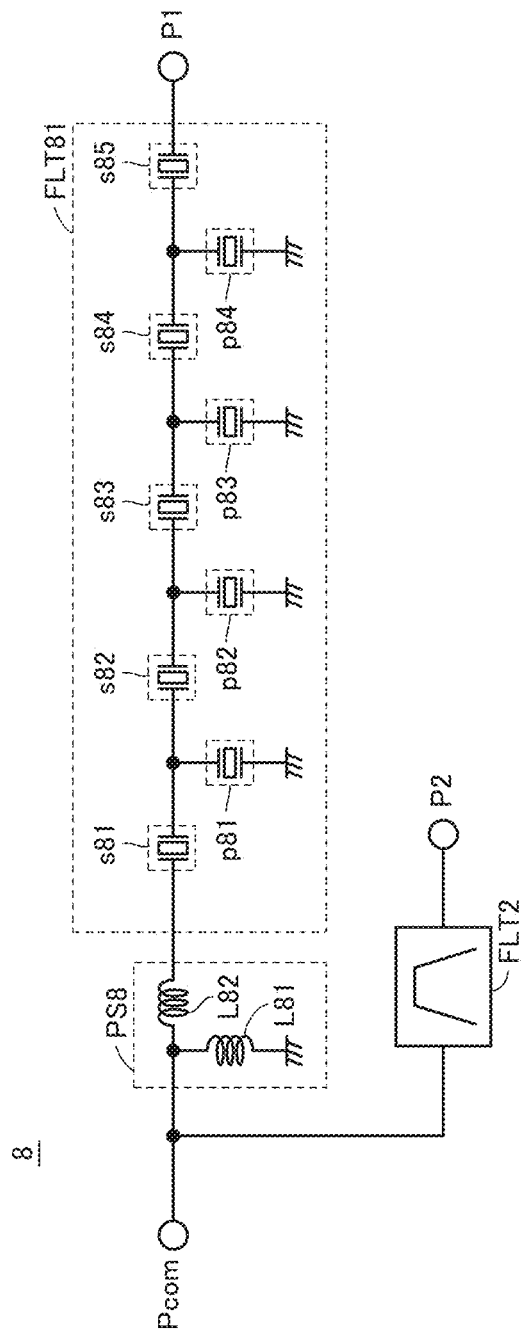
FIG. 13 is a circuit configuration diagram of a multiplexer according to Comparative Example 1.

FIG. 13 is a circuit configuration diagram of a multiplexer 8 in Comparative Example 1. The configuration of multiplexer 8 corresponds to the configuration of multiplexer 1 in FIG. 8 in which phase shifter PS1 and filter FLT1 are replaced with a phase shifter PS8 and a filter FLT81, respectively. The configurations of multiplexers 8 and 1 are similar to each other in other respects, and therefore, the description thereof is not repeated herein.

As shown in FIG. 13, phase shifter PS8 includes inductors L81, L82. Inductor L82 is connected between common terminal Pcom and filter FLT81. Inductor L81 is connected between the ground and a connecting point of common terminal Pcom and inductor L82.

Filter FLT81 includes series arm resonators s81 to s85 and parallel arm resonators p81 to p84. Series arm resonators s81 to s85 are series-connected in this order between phase shifter PS8 and input/output terminal P1. Parallel arm resonator p81 is connected between the ground and a connecting point of series arm resonators s81, s82. Parallel arm resonator p82 is connected between the ground and a connecting point of series arm resonators s82, s83. Parallel arm resonator p83 is connected between the ground and series arm resonators s83, s84. Parallel arm resonator p84 is connected between the ground and a connecting point of series arm resonators s84, s85.

Table 2 below shows the resonance frequency (fr), the antiresonance frequency (fa), and the fractional bandwidth (BWR) of each of series arm resonators s81 to s85 and parallel arm resonators p81 to p84 in Comparative Example 1.

TABLE 2

| | Series Arm Resonator | | | | |
|---|---|---|---|---|---|
| | s81 | s82 | s83 | s84 | s85 |
| fr [MHz] | 829.5 | 833.1 | 826.0 | 846.0 | 822.2 |
| fa [MHz] | 866.2 | 869.8 | 862.7 | 882.6 | 858.9 |
| BWR [%] | 4.42 | 4.40 | 4.44 | 4.32 | 4.47 |

TABLE 2-continued

| | Parallel Arm Resonator | | | |
|---|---|---|---|---|
| | p81 | p82 | p83 | p84 |
| fr [MHz] | 792.4 | 792.8 | 795.6 | 798.8 |
| fa [MHz] | 829.2 | 829.6 | 832.4 | 835.6 |
| BWR [%] | 4.65 | 4.64 | 4.63 | 4.61 |

From a comparison, in terms of the phase shifter, between multiplexer 1 in FIG. 8 and multiplexer 8 in FIG. 13, it is seen that the number of inductors in phase shifter PS1 in FIG. 8 is smaller than the number of inductors in phase shifter PS8 in FIG. 13. In multiplexer 1, the impedance at antiresonance frequency fa111 of series arm resonator s11a included in series arm circuit sc11 increases the impedance in passband PB2. Therefore, in multiplexer 1, the value of the impedance adjusted by phase shifter PS1 is advantageously smaller than that of multiplexer 8. As a result, the number of stages in phase shifter PS1 of multiplexer 1 can be made smaller than that in phase shifter PS8.

The elastic wave resonator is superior in Q characteristics than the inductor. Therefore, the number of stages in the circuit that forms the phase shifter can be reduced like multiplexer 1 so as to increase the impedance in passband PB2 by the elastic wave resonator included in filter FLT1, and thereby reduce the insertion loss, in passband PB1, of multiplexer 1.

The elastic wave resonator is smaller in size than the inductor in most cases. Therefore, the elastic wave resonator included in filter FLT1 can be used to increase the impedance in passband PB2 and reduce the number of stages in the circuit forming the phase shifter, and thereby downsize multiplexer 1.

FIG. 14 (a) is a Smith chart showing an impedance of the circuit other than phase shifter PS8, as filter FLT81 is seen from phase shifter PS8, and FIG. 14 (b) is a Smith chart showing an impedance as filter FLT81 is seen from common terminal Pcom. As shown in FIG. 14 (a), the impedance, in passband PB1, of filter FLT1 itself is matched and therefore distributed around normalized impedance Zc. The phase in passband PB2 ranges from −85 to −45 degrees and the phase at the higher edge of passband PB2 is smaller than −80 degrees and is not included in the range from −80 degrees to 80 degrees. As shown in FIG. 14 (b), the phase in passband PB2 is slid anticlockwise by phase shifter PS8, so that the phase ranges from −60 degrees to −15 degrees and is included in the range from −80 degrees to 80 degrees and located closer to zero degree that is the phase where the impedance is infinite.

FIG. 15 shows pass characteristics of multiplexer 1 in FIG. 8 and pass characteristics of multiplexer 8 in FIG. 13. FIG. 15 (a) shows pass characteristics from common terminal Pcom to input/output terminal P1. FIG. 15 (b) shows pass characteristics from common terminal Pcom to input/output terminal P2. FIG. 16 (a) shows, in an enlarged form, the pass characteristics in the range from 0 to 5 dB in passband PB1 in FIG. 15 (a), and FIG. 16 (b) shows, in an enlarged form, the pass characteristics in the range from 0 to 5 dB in passband PB2 in FIG. 15 (b). In FIGS. 15 and 16, the solid line represents a pass characteristic of multiplexer 1 and the dotted line represents a pass characteristic of multiplexer 8.

In FIG. 15 (a), the amount of attenuation in passband PB2 of multiplexer 1 and that of multiplexer 8 are 50.5 dB and 50.4 dB, respectively. Regarding the amount of attenuation in passband PB2 of the pass characteristic from common terminal Pcom to input/output terminal P1, the amount of attenuation of multiplexer 1 that is substantially identical to the amount of attenuation of multiplexer 8 is ensured. In FIG. 15 (b), the amount of attenuation in passband PB1 of multiplexer 1 and that of multiplexer 8 are 48.5 dB and 48.6 dB, respectively. Regarding the amount of attenuation in passband PB1 of the pass characteristic from common terminal Pcom to input/output terminal P2, the amount of attenuation of multiplexer 1 that is substantially identical to the amount of attenuation of multiplexer 8 is ensured. The amount of attenuation in a certain passband herein refers to the minimum value of the amount of attenuation in the passband.

In FIG. 16 (a), the insertion loss in passband PB1 of multiplexer 1 and that of multiplexer 8 are 2.24 dB and 2.45 dB, respectively. Regarding the insertion loss in passband PB1, multiplexer 1 is improved by approximately 0.21 dB relative to multiplexer 8. The insertion loss of multiplexer 1 in passband PB1 is reduced relative to multiplexer 8, in most of the range. In FIG. 16 (b), the insertion loss in passband PB2 of multiplexer 1 and that of multiplexer 8 are 2.03 dB and 2.15 dB, respectively. Regarding the insertion loss in passband PB2, multiplexer 1 is improved by approximately 0.12 dB relative to multiplexer 8. The insertion loss of multiplexer 1 in passband PB2 is reduced relative to the insertion loss of multiplexer 8. The insertion loss in a certain passband herein refers to the maximum value of the insertion loss in the passband.

With multiplexer 1, the insertion loss can be reduced while the amount of attenuation is maintained.

As seen from the foregoing, with the multiplexer according to Embodiment 1, the insertion loss can be reduced.

Embodiment 2

In connection with Embodiment 2, a description is given of a configuration for making at least one of the fractional bandwidth of the first series arm resonator and the fractional bandwidth of the second series arm resonator larger than the fractional bandwidth of an elastic wave resonator included in the first filter. This configuration enables expansion of the frequency band in which the insertion loss of the pass characteristic of the first filter is smaller than the value determined by adding a reference value (3 dB for example) to the minimum value of the insertion loss, and enables further reduction of the insertion loss of the multiplexer in the first passband.

Figure 17:
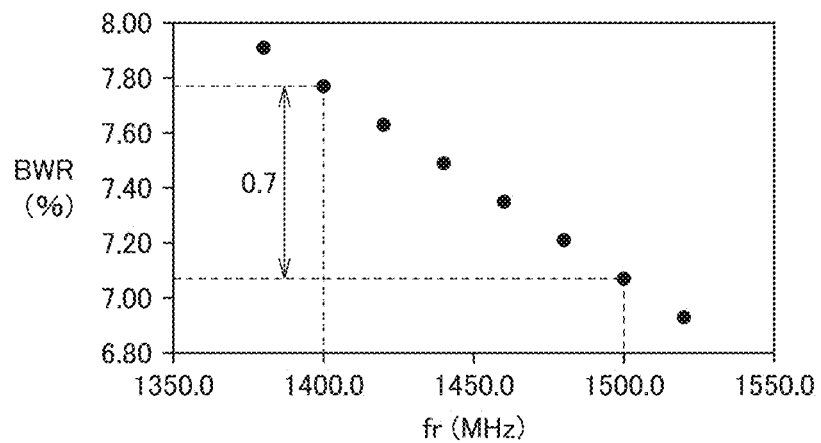
FIG. 17 shows a diagram and a table illustrating a relation between a resonance frequency and a fractional bandwidth of an elastic wave resonator according to the embodiment.

Referring first to FIG. 17, a relation between a resonance frequency (fr) and a fractional bandwidth (BWR) of a typical elastic wave resonator is described. As the resonance frequency of the elastic wave resonator is varied, the fractional bandwidth is varied. For a typical filter formed of a plurality of elastic wave resonators, the difference between respective resonance frequencies of a plurality of elastic wave resonators is approximately 100 MHz or less. As shown in FIG. 17, as the resonance frequency is varied by 100 MHz, the fractional bandwidth is varied by about 0.7%. It is thus assumed below that two fractional bandwidths are different from each other when the difference between the two fractional bandwidths is 0.8% or more, and that two fractional bandwidths are equal to each other when the difference between the two fractional bandwidths is less than 0.8%.

Figure 18:
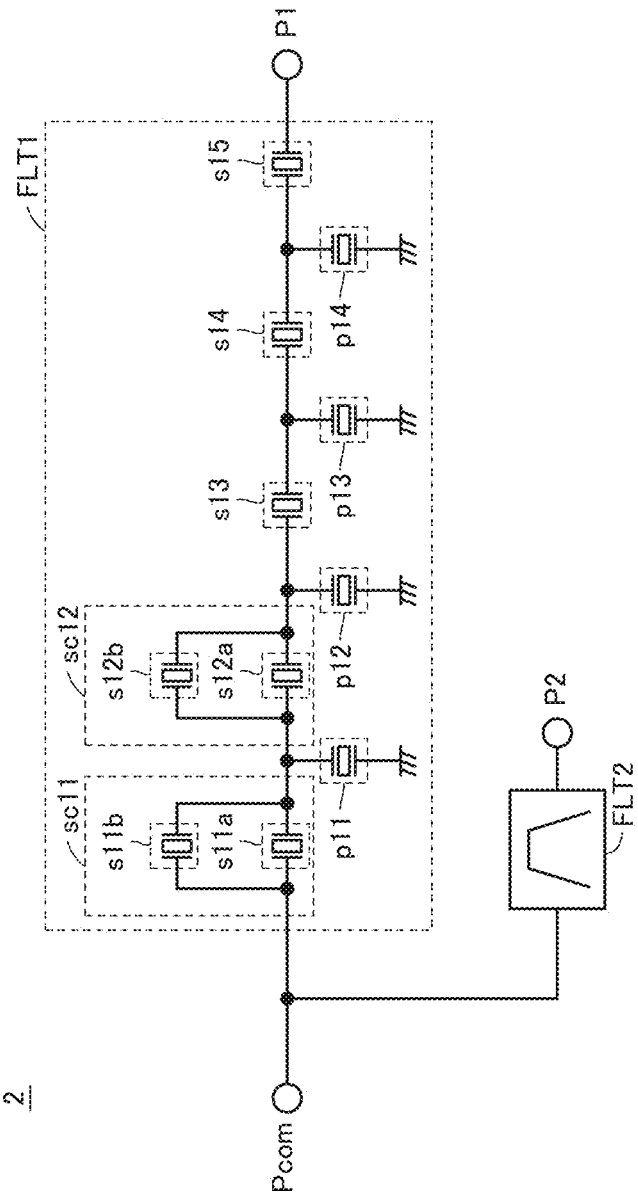
FIG. 18 is a circuit configuration diagram of a multiplexer according to Embodiment 2.

FIG. 18 is a circuit configuration diagram of a multiplexer 2 in Embodiment 2. The configuration of multiplexer 2 shown in FIG. 18 differs from the configuration of multiplexer 1 shown in FIG. 8 in that the former does not include phase shifter PS1 and that respective fractional bandwidths of series arm resonators s11a, s11b, s12a, s12b differ from those in FIG. 8. The configurations of multiplexers 2 and 1 are similar to each other in other respects, and therefore, the description thereof is not repeated herein.

Table 3 below shows the resonance frequency (fr), the antiresonance frequency (fa), and the fractional bandwidth (BWR) of each of series arm resonators s11a, s11b, s12a, s12b, s13 to s15 and parallel arm resonators p11 to p14, and shows the first resonance frequency (fr1), the first antiresonance frequency (fa1), the second resonance frequency (fr2), and the second antiresonance frequency (fa2) of each of series arm circuits sc11, sc12 in Embodiment 2.

TABLE 3

| Series Arm Resonator | s11a | s11b | s12a | s12b | s13 | s14 | s15 |
|---|---|---|---|---|---|---|---|
| fr [MHz] | 798.0 | 879.2 | 800.4 | 880.2 | 895.0 | 892.5 | 861.4 |
| fa [MHz] | 861.1 | 944.5 | 863.6 | 945.5 | 940.9 | 938.4 | 907.3 |
| BWR [%] | 7.91 | 7.42 | 7.90 | 7.42 | 5.13 | 5.15 | 5.33 |

| Series Arm Circuit | sc11 | sc12 |
|---|---|---|
| fr1 [MHz] | 798.0 | 800.4 |
| fa1 [MHz] | 819.2 | 809.2 |
| fr2 [MHz] | 879.2 | 880.2 |
| fa2 [MHz] | 922.3 | 936.3 |

| Parallel Arm Resonator | p11 | p12 | p13 | p14 |
|---|---|---|---|---|
| fr [MHz] | 848.8 | 848.2 | 832.0 | 832.6 |
| fa [MHz] | 885.4 | 884.8 | 868.7 | 869.3 |
| BWR [%] | 4.31 | 4.31 | 4.41 | 4.40 |

As shown in Table 3, respective fractional bandwidths of series arm resonators s11a, s11b, s12a, s12b are larger than respective fractional bandwidths of other resonators by 0.8 or more. Namely, in Embodiment 2, respective fractional bandwidths of series arm resonators s11a, s11b, s12a, s12b are larger than respective fractional bandwidths of other resonators.

Figure 19:
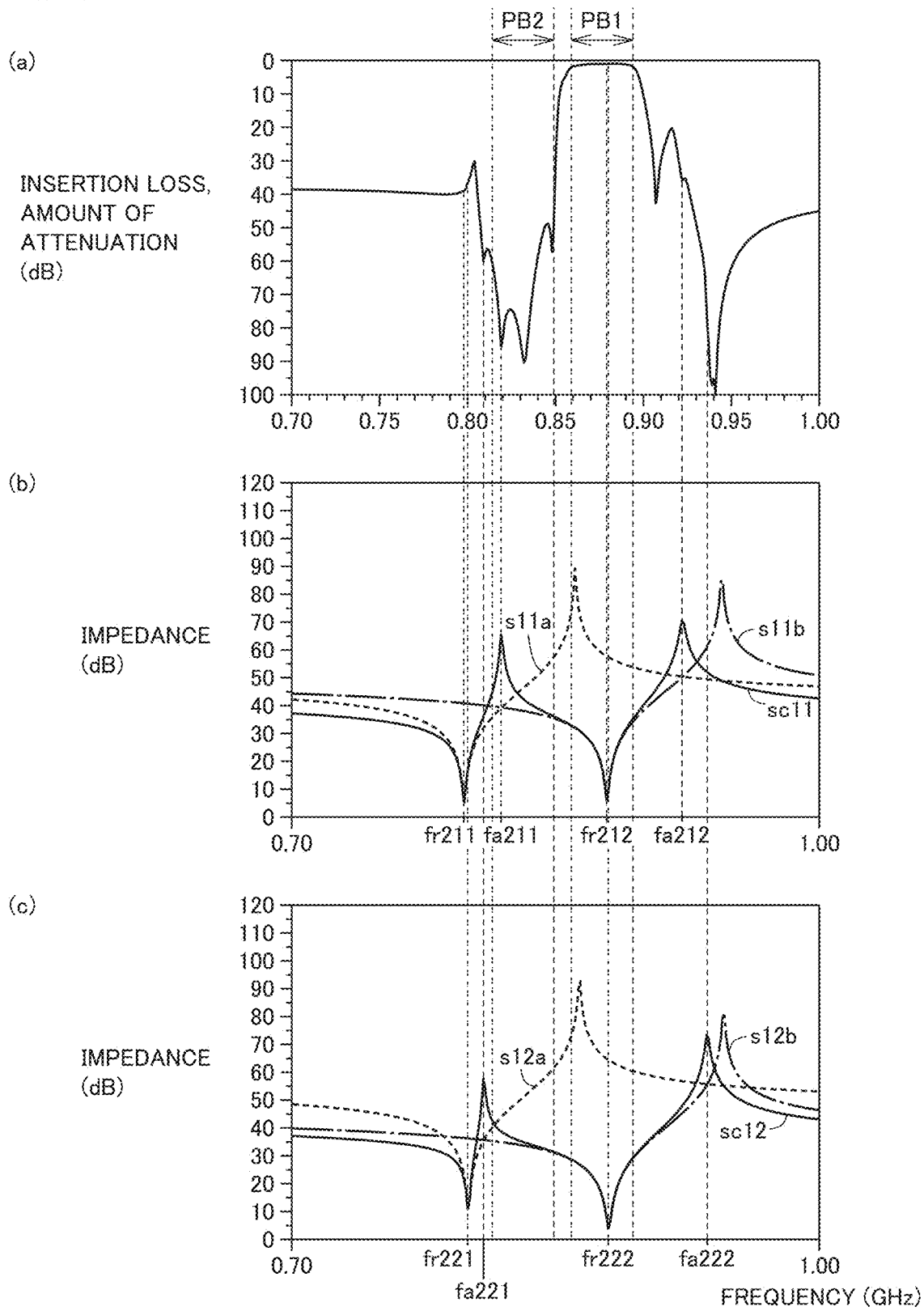
FIG. 19 (a) shows a pass characteristic of the first filter, FIG. 19 (b) shows an impedance characteristic of a first series arm circuit, and FIG. 19 (c) shows an impedance characteristic of a second series arm circuit.

FIG. 19 (a) shows a pass characteristic of filter FLT1, FIG. 19 (b) shows an impedance characteristic of series arm circuit sc11, and FIG. 19 (c) shows an impedance characteristic of series arm circuit sc12. FIG. 19 (b) also shows respective impedance characteristics of series arm resonators s11a, s11b. FIG. 19 (c) also shows respective impedance characteristics of series arm resonators s12a, s12b.

As shown in FIG. 19 (b), series arm circuit sc11 has a resonance frequency fr211 (first resonance frequency), an antiresonance frequency fa211 (first antiresonance frequency), a resonance frequency fr212 (second resonance frequency), and an antiresonance frequency fa212 (second antiresonance frequency). Antiresonance frequency fa211 is higher than resonance frequency fr211. Resonance frequency fr212 is higher than antiresonance frequency fa211. Antiresonance frequency fa212 is higher than resonance frequency fr212.

Antiresonance frequency fa211 is included in passband PB2 to form an attenuation pole and increase the impedance of filter FLT1 in passband PB2, so that passage, through filter FLT1, of a signal in passband PB2 is hindered. Antiresonance frequency fa212 is higher than the higher edge of passband PB1 to form an attenuation pole and increase the impedance of filter FLT1 in a frequency band higher than passband PB1, so that passage, through filter FLT1, of a signal in a frequency band higher than passband PB1 is hindered. Resonance frequency fr212 is included in passband PB1 to reduce the impedance of filter FLT1 in passband PB1, so that passage, through filter FLT1, of a signal in passband PB1 is facilitated. Resonance frequency fr211 is not included in passband PB2, and generation of ripples in passband PB2 is suppressed.

As shown in FIG. 19 (c), series arm circuit sc12 has a resonance frequency fr221, an antiresonance frequency fa221 (>fr221), a resonance frequency fr222 (>fa221), and an antiresonance frequency fa222 (>fr222). Antiresonance frequency fa221 is lower than passband PB2 to form an attenuation pole and increase the impedance in a frequency band lower than passband PB2, so that passage, through filter FLT1, of a signal in a frequency band lower than passband PB2 is hindered. Antiresonance frequency fa222 is higher than the higher edge of passband PB1, to form an attenuation pole and increase the impedance of filter FLT1 in a frequency band higher than passband PB1, so that passage, through filter FLT1, of a signal in a frequency band higher than passband PB1 is hindered. Resonance frequency fr222 is included in passband PB1 to reduce the impedance of filter FLT1 in passband PB1, so that passage, through filter FLT1, of a signal in passband PB1 is facilitated. Resonance frequency fr221 is not included in passband PB2, and generation of ripples in passband PB2 is suppressed.

Figure 20:
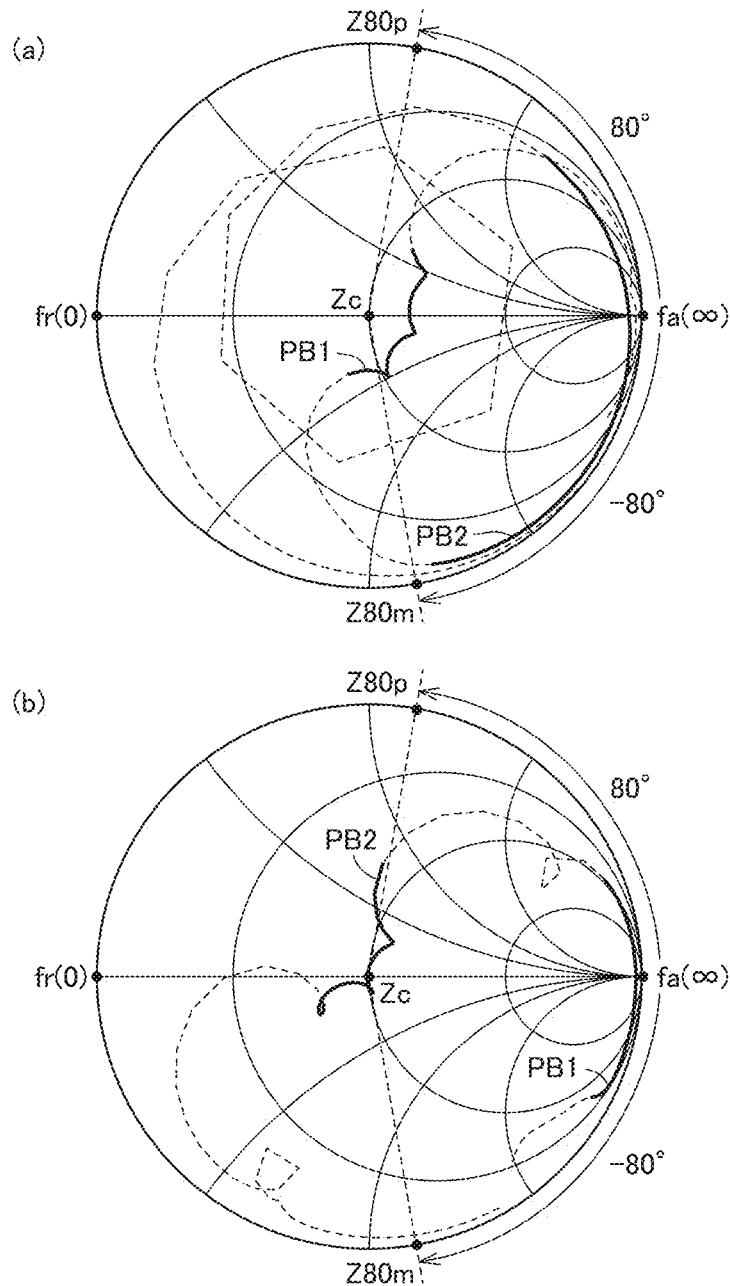
FIG. 20 (a) is a Smith chart showing an impedance as the first filter is seen from the common terminal, and FIG. 20 (b) is a Smith chart showing an impedance as the second filter is seen from the common terminal.

FIG. 20 (a) is a Smith chart showing an impedance as filter FLT1 is seen from common terminal Pcom, and FIG. 20 (b) is a Smith chart showing an impedance as filter FLT2 is seen from common terminal Pcom. As shown in FIG. 20 (a), the impedance, in passband PB1, of filter FLT1 itself is matched with normalized impedance Zc and therefore distributed around normalized impedance Zc. The phase in passband PB2 ranges from −76 degrees to 41 degrees, and is included in the range from −80 degrees to 80 degrees. As shown in FIG. 20 (b), the impedance, in passband PB2, of filter FLT2 itself is matched with normalized impedance Zc and therefore distributed around normalized impedance Zc. The phase in passband PB1 ranges from −28 degrees to 22 degrees, and is included in the range from −80 degrees to 80 degrees.

Figure 21:
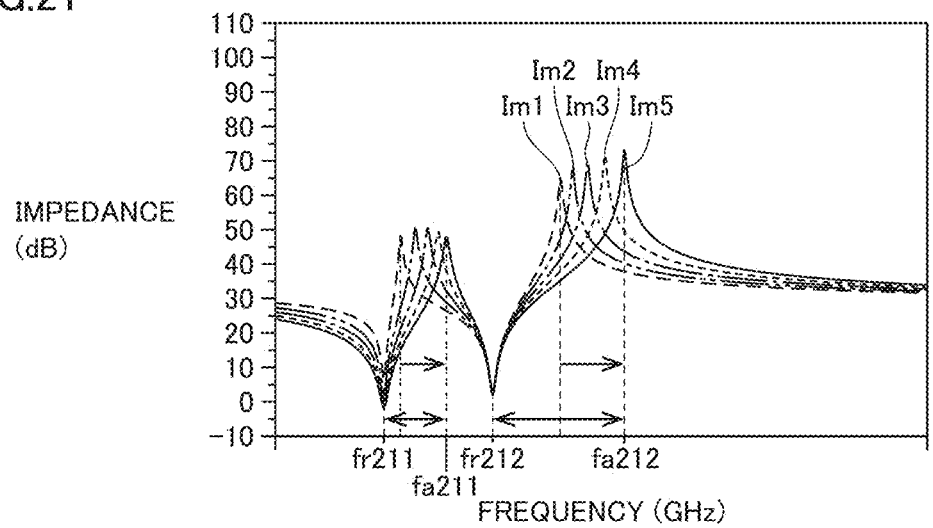
FIG. 21 shows a change in impedance characteristic of the first series arm circuit when the fractional bandwidth of the first series arm resonator is varied.

FIG. 21 shows variation of the impedance characteristic of series arm circuit sc11 when the fractional bandwidth of series arm resonator s11a is varied. In FIG. 21, the fractional bandwidth of series arm resonator s11a is larger in the order of impedance characteristics Im1 to Im5.

As shown in FIG. 21, as the fractional bandwidth of series arm resonator s11a is larger, the difference between resonance frequency fr211 and antiresonance frequency fa211 is larger, so that inclusion of resonance frequency fr211 in a frequency band lower than passband PB2 is facilitated. When resonance frequency fr211 is not included in passband PB2, generation of ripples in passband PB2 is suppressed. It is therefore desirable that the fractional bandwidth of series arm resonator s11a is larger than that of series arm resonator s11b.

When the elastic wave resonator is a SAW resonator, the fractional bandwidth of the elastic wave resonator can be changed by providing a first adjustment film formed of an insulator or a dielectric between IDT (interdigital transducer) electrodes formed on a piezoelectric substrate and the piezoelectric substrate and changing the thickness of the first adjustment film. The fractional bandwidth is largest in the absence of the first adjustment film, and the fractional bandwidth is decreased as the thickness of the first adjustment film is increased. The fractional bandwidth of the SAW resonator can also be changed by providing a second adjustment film formed of an insulator or a dielectric to cover the interdigitated electrodes and changing the thickness of the second adjustment film. The fractional bandwidth is largest in the absence of the second adjustment film, and the fractional bandwidth is decreased as the thickness of the second adjustment film is increased.

When the elastic wave resonator is a BAW resonator, the fractional bandwidth can be changed by changing the material for a piezoelectric member between electrodes opposite to each other.

Figure 22:
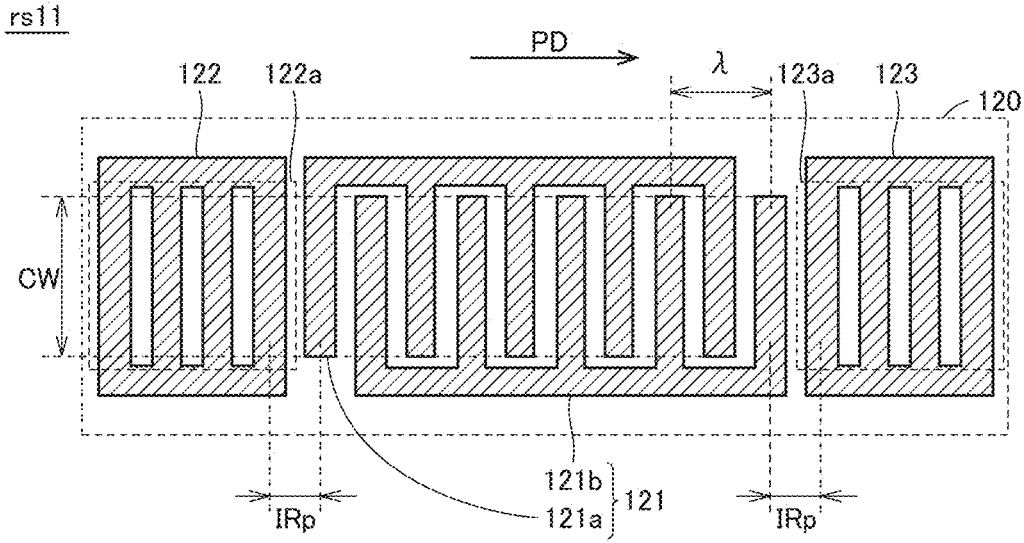
FIG. 22 is a plan view schematically showing an electrode structure of an elastic wave resonator forming a series arm resonator.

FIG. 22 is a plan view schematically showing an electrode structure of a typical elastic wave resonator rs11 using a surface acoustic wave. As shown in FIG. 22, elastic wave resonator rs11 includes an IDT electrode 121 and reflectors 122, 123. IDT electrode 121 and reflectors 122, 123 are formed on a piezoelectric substrate 120 and arranged in a propagation direction PD of the surface acoustic wave.

Reflectors 122 and 123 include a plurality of electrode fingers 122a and a plurality of electrode fingers 123a, respectively. Reflectors 122 and 123 sandwich IDT electrode 121 in between. Reflectors 122 and 123 each have a structure (grating) of a periodically repeated pattern of a plurality of electrode fingers. IDT electrode 121 includes a plurality of electrode fingers 121a, 121b.

Among a plurality of electrode fingers 121a, 121b, the number of electrode fingers forming pairs is referred to as the number of finger pairs. The number of finger pairs is approximately a half of the number of a plurality of electrode fingers 121a, 121b. The total number M of electrode fingers 121a, 121b is M=2N+1, where N is the number of finger pairs, for example.

Wavelength λ of the surface acoustic wave excited by IDT electrode 121 is determined by the electrode period of electrode fingers 121a, 121b. Reflectors 122, 123 each reflect the surface acoustic wave excited by the IDT electrode. In a frequency band (stop band) defined for example by the electrode pitch between a plurality of electrode fingers forming reflectors 122, 123, the surface acoustic wave excited by IDT electrode 121 is reflected by reflectors 122, 123 with a high reflection coefficient.

An I-R pitch IRp refers to the pitch between electrode finger 121a and electrode finger 122a that are adjacent to each other, among a plurality of electrode fingers 121a and a plurality of electrode fingers 122a, and the pitch between electrode finger 121b and electrode finger 123a that are adjacent to each other, among a plurality of electrode fingers 121b and a plurality of electrode fingers 123a. Cross width CW refers to the length of the overlapping portion of a plurality of electrode fingers 121a and a plurality of electrode fingers 121b, as seen in the propagation direction of the surface acoustic wave. When elastic wave resonator rs11 is a weighted SAW resonator, cross width CW refers to the average of overlapping portions of a plurality of electrode fingers 121a and a plurality of electrode fingers 121b, as seen in the propagation direction of the surface acoustic wave. The ratio of the cross width to the number of finger pairs (cross width/number of finger pairs) is referred to as aspect ratio.

In the following, with reference to FIG. 23, a description is given of an effective range of the I-R pitch of series arm resonator s11a and series arm resonator s11b, in terms of reduction of the insertion loss. Further with reference to FIG. 24, a description is given of an appropriate relation in magnitude between the aspect ratio of series arm resonator s11a and the aspect ratio of series arm resonator s11b, in terms of reduction of the insertion loss.

Figure 23:
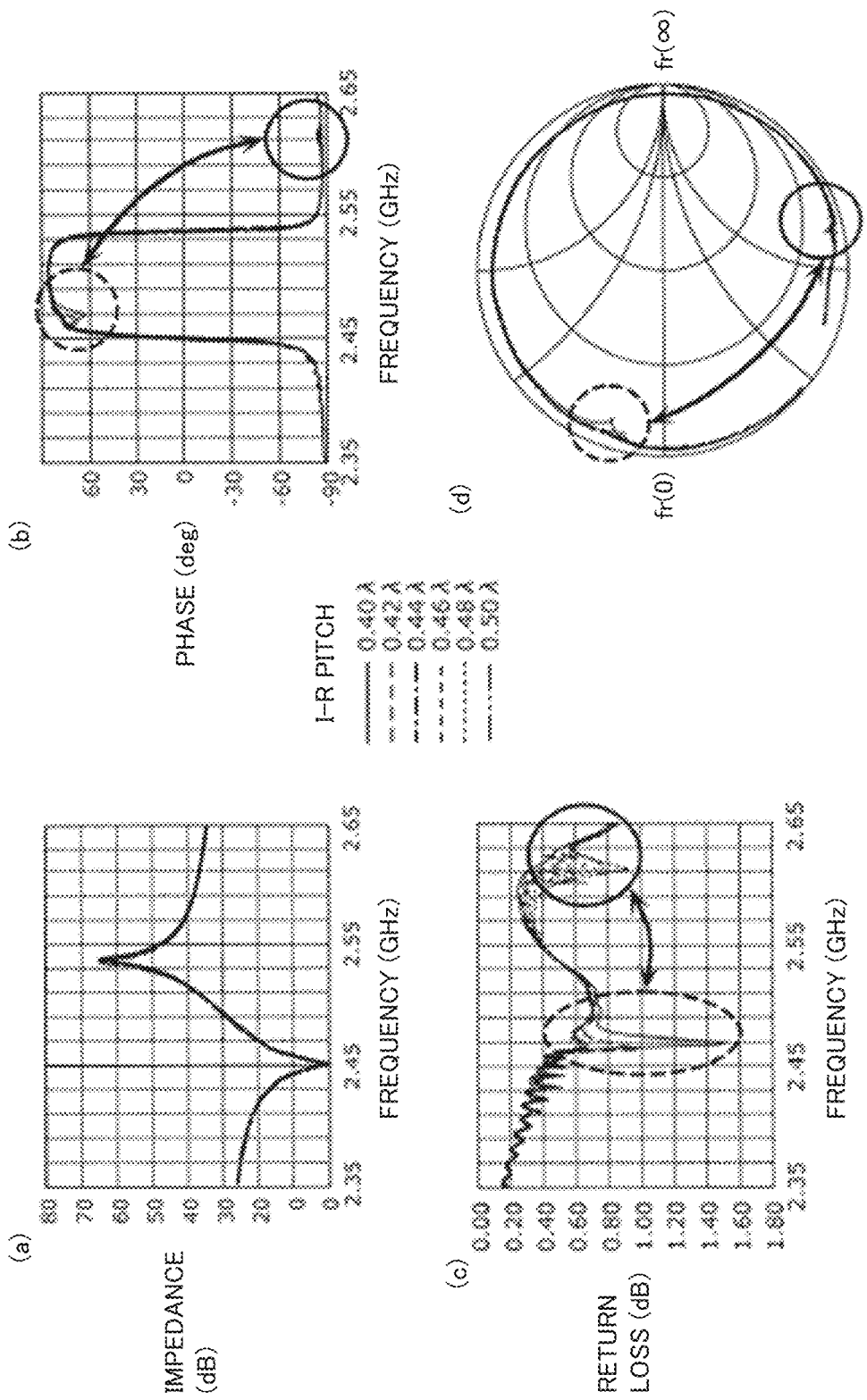
FIG. 23 (a) shows a change of an impedance characteristic of an elastic wave resonator, FIG. 23 (b) shows a change of a phase characteristic, FIG. 23 (c) shows a change of a reflection characteristic, and FIG. 23 (d) shows a change of the impedance on a Smith chart, as the I-R pitch of the elastic wave resonator is varied.

FIG. 23 (a) shows a change of an impedance characteristic of elastic wave resonator rs11, FIG. 23 (b) shows a change of a phase characteristic, FIG. 23 (c) shows a change of a reflection characteristic (a frequency characteristic of the return loss), and FIG. 23 (d) shows a change of the impedance on a Smith chart, as the I-R pitch of elastic wave resonator rs11 is varied. As seen from the legend in FIG. 23, each change that is caused as I-R pitch IRp is varied from 0.40λ, to 0.50λ, in increments of 0.02λ, is shown.

As shown in FIG. 23, as the I-R pitch is smaller, ripples (enclosed by the solid line in FIG. 23 (b) to FIG. 23 (d)) at the higher edge of the stop band higher than the antiresonance frequency are suppressed to a greater extent. Meanwhile, as the I-R pitch is smaller, ripples (enclosed by the broken line in FIG. 23 (b) to FIG. 23 (d)) are generated in the frequency band between the resonance frequency and the antiresonance frequency. The ripples generated in the frequency band between the resonance frequency and the antiresonance frequency are larger as the I-R pitch is smaller.

In the following, supposing that series arm resonators s11a, s11b have the electrode structure shown in FIG. 22, an appropriate range of the I-R pitch of series arm resonator s11a and an appropriate range of the I-R pitch of series arm resonator s11b are described. In the electrode structure of series arm resonator s11a, IDT electrode 121, a plurality of electrode fingers 121a, 121b, the electrode period of electrode fingers 121a, 121b, reflectors 122, 123, and a plurality of electrode fingers 122a, 123a in FIG. 22 correspond respectively to first IDT electrode, a plurality of first electrode fingers, first electrode period, first reflector, and a plurality of second electrode fingers, respectively. In the electrode structure of series arm resonator s11b, IDT electrode 121, a plurality of electrode fingers 121a, 121b, the electrode period of electrode fingers 121a, 121b, reflectors 122, 123, and a plurality of electrode fingers 122a, 123a in FIG. 22 correspond respectively to second IDT electrode, a plurality of third electrode fingers, second electrode period, second reflector, and a plurality of fourth electrode fingers, respectively.

In most cases, the higher edge of the stop band of series arm resonator s11a is included in passband PB1. Therefore, if ripples are generated at the higher edge of the stop band, the insertion loss in passband PB1 increases. I-R pitch IRp of series arm resonator s11a can be set to less than 0.50α, where α is the wavelength of the elastic wave determined by the first electrode period, so that ripples at the higher edge of the stop band can be suppressed and the insertion loss in passband PB1 due to the ripples can be reduced.

Regarding series arm resonator s11a, the frequency band between the resonance frequency and the antiresonance frequency overlaps passband PB2. Therefore, if ripples are generated in this frequency band, the attenuation characteristic in passband PB2 of filter FLT1 could be deteriorated. In view of this, the I-R pitch of series arm resonator s11a can be set to 0.42α or more to suppress ripples generated in the frequency band between the resonance frequency and the antiresonance frequency. As a result, deterioration of the attenuation characteristic in passband PB2 of filter FLT1 due to the ripples can be suppressed.

As seen from the above, I-R pitch IRp of series arm resonator s11a can be set to 0.42α or more and less than 0.50α to suppress deterioration of the attenuation characteristic of filter FLT1 in passband PB2, and also reduce the insertion loss of filter FLT1 in passband PB1.

The frequency band between the resonance frequency and the antiresonance frequency of series arm resonator s11b overlaps passband PB1. Therefore, generation of ripples in this frequency band could cause increase of the insertion loss in passband PB1 of filter FLT1. I-R pitch IRp of series arm resonator s11b can be set to 0.44β or more, where is the wavelength of the elastic wave determined by the second electrode period, to suppress ripples generated in the frequency band between the resonance frequency and the antiresonance frequency. As a result, the insertion loss in passband PB1 of filter FLT1 can further be reduced.

Figure 24:
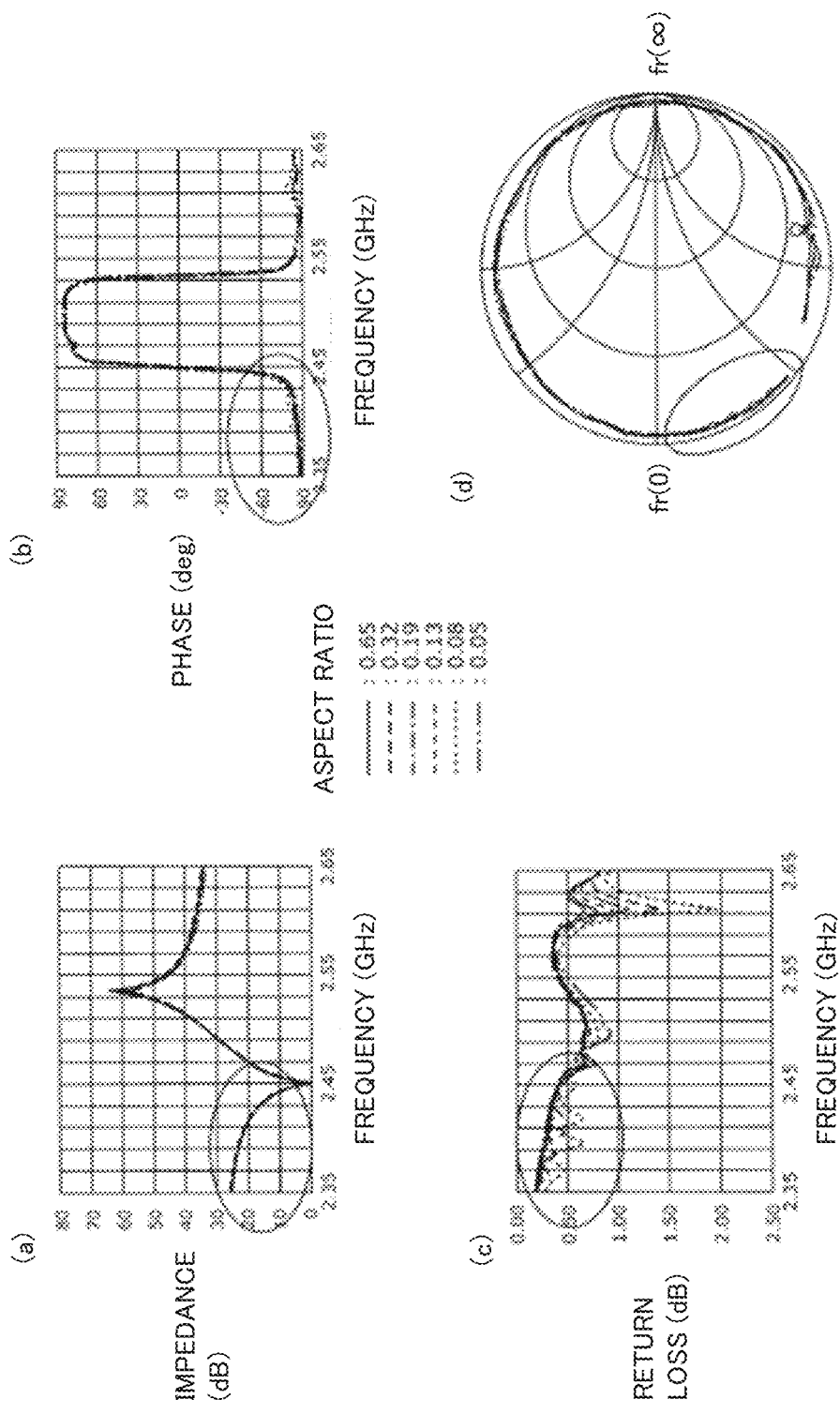
FIG. 24 (a) shows a change of an impedance characteristic of an elastic wave resonator, FIG. 24 (b) shows a change of a phase characteristic, FIG. 24 (c) shows a change of a reflection characteristic, and FIG. 24 (d) shows a change of the impedance on a Smith chart, as the aspect ratio of the elastic wave resonator is varied.

FIG. 24 (a) shows a change of an impedance characteristic of elastic wave resonator rs11, FIG. 24 (b) shows a change of a phase characteristic, FIG. 24 (c) shows a change of a reflection characteristic, and FIG. 24 (d) shows a change of the impedance on a Smith chart, as the aspect ratio of elastic wave resonator rs11 is varied. As seen from the legend in FIG. 24, each change that is caused as the aspect ratio is varies to 0.65, 0.32, 0.19, 0.13, 0.08, and 0.05 (all expressed in [μm/number of finger pairs]) is shown.

As shown in FIG. 24 (a) and FIG. 24 (b), in the frequency band lower than the resonance frequency, ripples (local changes) of the side lobes in the stop band provided by the grating are larger as the number of finger pairs is smaller. This is due to increase of ripples of the reflection coefficient as the number of finger pairs is smaller in this frequency band, as shown in FIG. 24 (c) and FIG. 24 (d).

The frequency band lower than the resonance frequency of series arm resonator s11b overlaps passband PB1 of filter FLT1. Therefore, in order to suppress ripples in passband PB1, it is preferable to make the number of finger pairs of series arm resonator s11b larger than the number of finger pairs of series arm resonator s11a, and thereby make the aspect ratio of series arm resonator s11b smaller than the aspect ratio of series arm resonator s11a. With such a configuration, ripples in passband PB1 can be suppressed to reduce the insertion loss in passband PB1.

FIG. 25 shows pass characteristics of multiplexer 2 in FIG. 18 and pass characteristics of multiplexer 1 in FIG. 8. FIG. 25 (a) shows pass characteristics from common terminal Pcom to input/output terminal P1. FIG. 25 (b) shows pass characteristics from common terminal Pcom to input/output terminal P2. FIG. 26 (a) shows, in an enlarged form, the pass characteristics in the range from 0 to 5 dB in passband PB1 in FIG. 25 (a), and FIG. 26 (b) shows, in an enlarged form, the pass characteristics in the range from 0 to 5 dB in passband PB2 in FIG. 25 (b). In FIGS. 25 and 26, the solid line represents a pass characteristic of multiplexer 2 and the dotted line represents a pass characteristic of multiplexer 1.

As shown in FIG. 26 (a), in passband PB1, the insertion loss of multiplexer 2 is smaller than the insertion loss of multiplexer 1. Moreover, multiplexer 2 is wider than multiplexer 1 in terms of the frequency band in which the insertion loss is smaller than the value determined by adding 3 dB to the minimum value of the insertion loss. As a result, the insertion loss of multiplexer 2 in passband PB1 can further be made smaller than that of multiplexer 1. As shown in FIG. 26 (b), in passband PB2, the insertion loss of multiplexer 2 is substantially identical to the insertion loss of multiplexer 1.

Regarding passband PB2, multiplexer 2 maintains a similar pass characteristic to multiplexer 1.

As seen from the foregoing, with the multiplexer according to Embodiment 2, the insertion loss can further be reduced relative to the multiplexer according to Embodiment 1.

Embodiment 3

In connection with Embodiment 3, the first filter having the series arm circuit that includes longitudinally coupled resonators is described. This configuration enables improvements of the attenuation characteristic of the multiplexer in the second passband.

Figure 27:
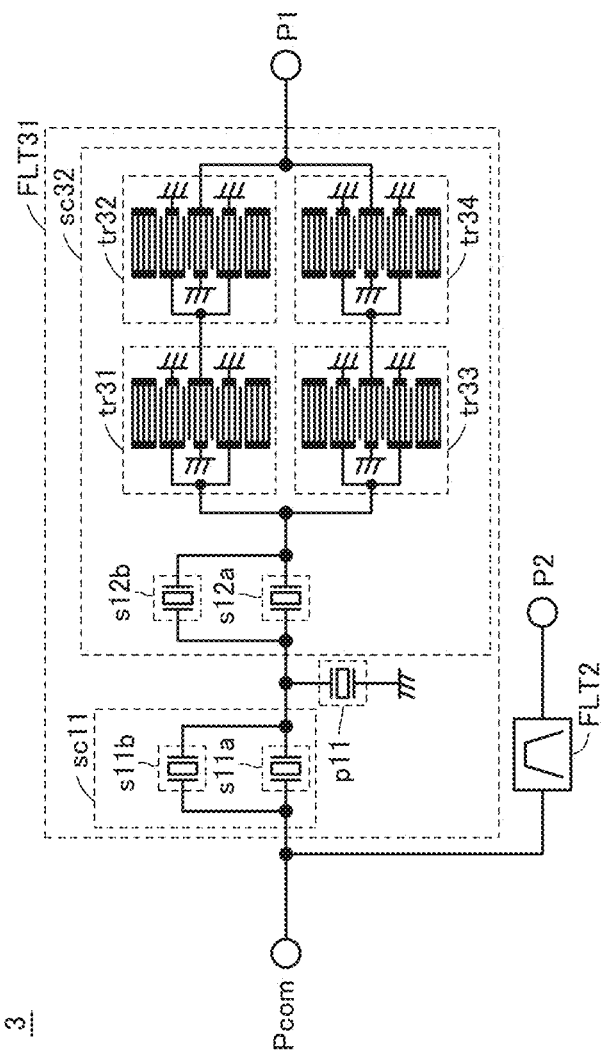
FIG. 27 is a circuit configuration diagram of a multiplexer according to Embodiment 3.

FIG. 27 is a circuit configuration diagram of a multiplexer 3 according to Embodiment 3. The configuration of multiplexer 3 corresponds to the configuration of multiplexer 2 in FIG. 18 in which filter FLT1 is replaced with a filter FLT31. The configuration of filter FLT31 corresponds to the configuration of filter FLT1 in which series arm circuit sc12 is replaced with a series arm circuit sc32, and series arm resonators s13 to s15 and parallel arm resonators p12 to p14 are removed. The configuration of series arm circuit sc32 corresponds to the configuration of series arm circuit sc12 to which longitudinally coupled resonators tr31 to tr34 are added. The configurations of multiplexers 3 and 2 are similar to each other in other respects, and therefore, the description thereof is not repeated herein.

As shown in FIG. 27, longitudinally coupled resonators tr31, tr32 are connected in series between input/output terminal P1 and a connecting point of series arm resonators s12a, s12b. Longitudinally coupled resonators tr33, tr34 are connected in series between input/output terminal P1 and a connecting point of series arm resonators s12a, s12b, and connected in parallel with series-connected longitudinally coupled resonators tr31, tr32.

Longitudinally coupled resonators tr31 to tr34 each include two reflectors and three IDT electrodes arranged linearly between these two reflectors. Longitudinally coupled resonators tr31 to tr34 have a passband PB30 (third passband).

Figure 28:
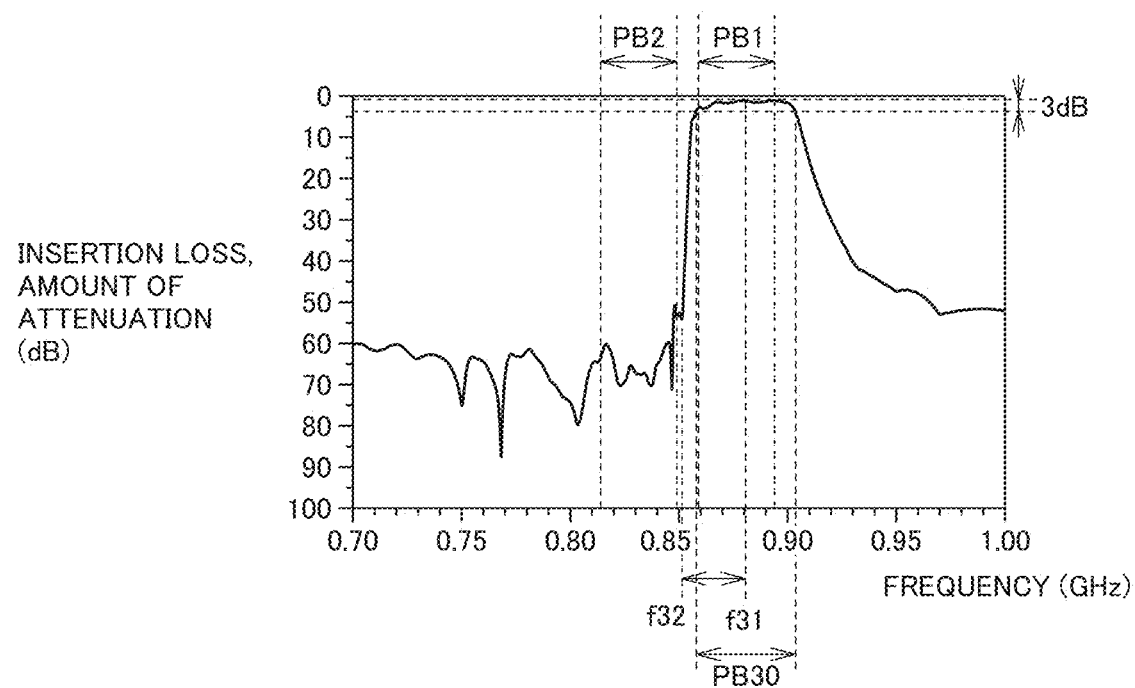
FIG. 28 is a diagram showing a pass characteristic of a longitudinally coupled resonator.

FIG. 28 is a diagram showing a pass characteristic of a composite circuit of longitudinally coupled resonators tr31 to tr34. In FIG. 28, frequency f31 is the center frequency of passband PB30. As shown in FIG. 28, passband PB30 includes passband PB1. Center frequency f31 is included in passband PB1. In the frequency band lower than passband PB30, a plurality of attenuation poles are generated. Frequency f32 is the frequency of the attenuation pole closest to center frequency f31. The fractional bandwidth of longitudinally coupled resonators tr31 to tr34 is represented by the value determined by dividing, by frequency f32, the difference between center frequency f31 and frequency f32 ((f31−f32)/f32). Regarding multiplexer 3, the fractional bandwidth of series arm resonator s11a is larger than the fractional bandwidth of longitudinally coupled resonators tr31 to tr34.

Figure 29:
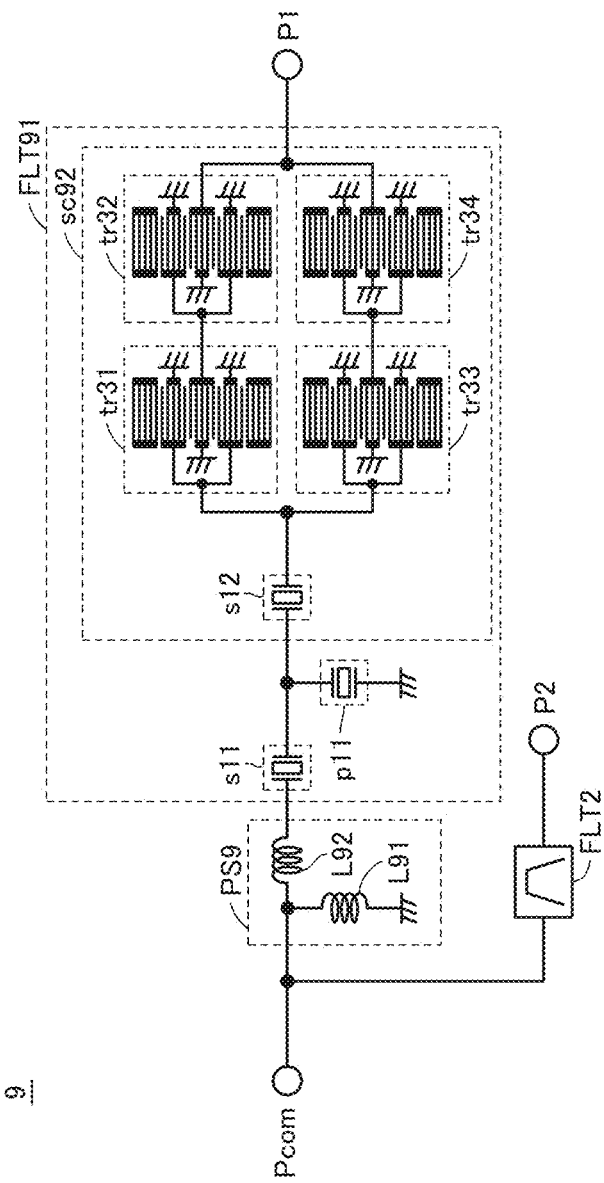
FIG. 29 is a circuit configuration diagram of a multiplexer according to Comparative Example 2.

FIG. 29 is a circuit configuration diagram of a multiplexer 9 according to Comparative Example 2. The configuration of multiplexer 9 corresponds to the configuration of multiplexer 3 in FIG. 27 in which a phase shifter PS9 is additionally included and filter FLT31 is replaced with a filter FLT91. The configuration of filter FLT91 corresponds to the configuration of filter FLT31 in which series arm circuits sc11, sc32 are replaced with a series arm resonator s11 and a series arm circuit sc92, respectively. The configuration of series arm circuit sc92 corresponds to the configuration in filter FLT31 in which series arm resonators s12a, s12b connected in parallel are replaced with a series arm resonator s12. The configurations of multiplexers 9 and 3 are similar to each other in other respects, and therefore, the description thereof is not repeated herein.

As shown in FIG. 29, phase shifter PS9 is connected between filter FLT91 and a connecting point of common terminal Pcom and filter FLT2. Phase shifter PS9 includes inductors L91, L92. Inductor L92 is connected between common terminal Pcom and filter FLT91. Inductor L91 is connected between the ground and a connecting point of common terminal Pcom and inductor L92.

FIG. 30 shows pass characteristics of multiplexer 3 in FIG. 27 and pass characteristics of multiplexer 9 in FIG. 29. FIG. 30 (a) shows pass characteristics from common terminal Pcom to input/output terminal P1. FIG. 30 (b) shows pass characteristics from common terminal Pcom to input/output terminal P2. As shown in FIG. 30 (a), in passband PB2, the insertion loss of multiplexer 3 is larger than the insertion loss of multiplexer 9. In passband PB2, the attenuation characteristic of multiplexer 3 is improved relative to the attenuation characteristic of multiplexer 9.

FIG. 31 (a) shows, in an enlarged form, the pass characteristics in the range from 0 to 5 dB in passband PB1 in FIG. 30 (a), and FIG. 31 (b) shows, in an enlarged form, the pass characteristics in the range from 0 to 5 dB in passband PB2 in FIG. 30 (b). In FIGS. 30 and 31, the solid line represents the pass characteristic of multiplexer 3 and the dotted line represents the pass characteristic of multiplexer 9.

As shown in FIG. 31 (a), in passband PB1, the insertion loss of multiplexer 3 is smaller than the insertion loss of multiplexer 9. As shown in FIG. 31 (b), in passband PB2, the insertion loss of multiplexer 3 is smaller than the insertion loss of multiplexer 9.

As seen from the foregoing, with the multiplexer according to Embodiment 3, the insertion loss can be reduced and the attenuation characteristic in the second passband for the pass characteristic from the common terminal to the first terminal can be improved.

Embodiment 4

In connection with Embodiment 4, a configuration in which the series resonance circuit included in the first filter includes two series arm resonators that are different in antiresonance frequency from each other is described.

Figure 32:
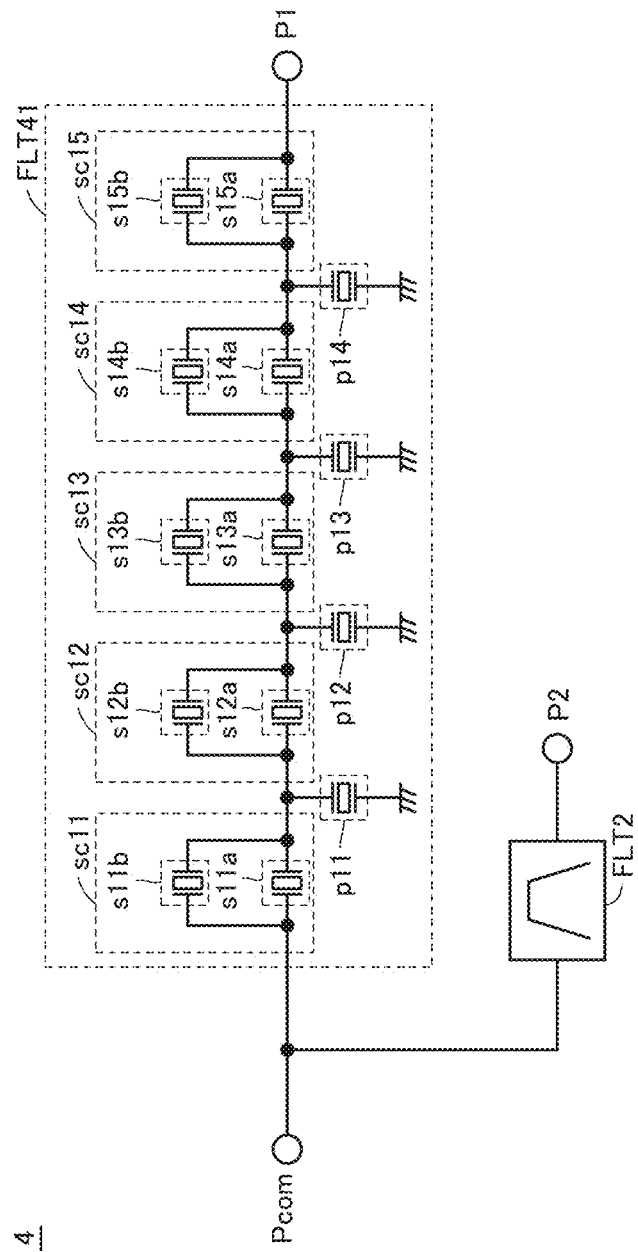
FIG. 32 is a circuit configuration diagram of a multiplexer according to Embodiment 4.

FIG. 32 is a circuit configuration diagram of a multiplexer 4 according to Embodiment 4. The configuration of multiplexer 4 corresponds to the configuration of multiplexer 2 in FIG. 18 in which filter FLT1 is replaced with a filter FLT41. The configuration of filter FLT41 corresponds to the configuration of filter FLT1 in which series arm resonators s13 to s15 are replaced with a series arm circuit sc13 (second series arm circuit), a series arm circuit sc14 (second series arm circuit), and a series arm circuit sc15 (second series arm circuit), respectively. The configurations of multiplexers 4 and 2 are similar to each other in other respects, and therefore, the description thereof is not repeated herein.

As shown in FIG. 32, series arm circuit sc13 includes series arm resonators s13a, s13b that differ from each other in antiresonance frequency. Series arm circuit sc14 includes series arm resonators s14a, s14b that differ from each other in antiresonance frequency. Series arm circuit sc15 includes series arm resonators s15a, s15b that differ from each other in antiresonance frequency.

Each of series arm circuits sc13 to sc15 has two antiresonance frequencies (third antiresonance frequency and fourth antiresonance frequency). The higher one (fourth antiresonance frequency) of the two antiresonance frequencies is higher than the higher edge of passband PB1. The lower one (third antiresonance frequency) of the two antiresonance frequencies is at or lower than the higher edge of passband PB2.

FIG. 33 shows pass characteristics of multiplexer 4 in FIG. 32 and pass characteristics of multiplexer 2 in FIG. 18. FIG. 33 (a) shows pass characteristics from common terminal Pcom to input/output terminal P1. FIG. 33 (b) shows pass characteristics from common terminal Pcom to input/output terminal P2. FIG. 34 (a) shows, in an enlarged form, the pass characteristics in the range from 0 to 5 dB in passband PB1 in FIG. 33 (a), and FIG. 34 (b) shows, in an enlarged form, the pass characteristics in the range from 0 to 5 dB in passband PB2 in FIG. 33 (b). In FIGS. 33 and 34, the solid line represents the pass characteristic of multiplexer 4 and the dotted line represents the pass characteristic of multiplexer 2.

In FIG. 33 (a), the amount of attenuation in passband PB2 of multiplexer 4 and that of multiplexer 2 are 53.4 dB and 50.6 dB, respectively. In terms of the amount of attenuation in passband PB2 for the pass characteristic from common terminal Pcom to input/output terminal P1, multiplexer 4 is improved by approximately 2.8 dB relative to multiplexer 2. In FIG. 33 (b), the amount of attenuation in passband PB1 of multiplexer 4 and that of multiplexer 2 are 48.1 dB and 48.5 dB, respectively. In terms of the amount of attenuation in passband PB1 for the pass characteristic from common terminal Pcom to input/output terminal P2, multiplexer 4 also ensures the amount of attenuation substantially identical to that of multiplexer 2.

As shown in FIG. 34 (a), in passband PB1, the insertion loss of multiplexer 4 is substantially identical to the insertion loss of multiplexer 2. Multiplexer 4 is wider than multiplexer 2 in terms of the frequency band in which the insertion loss is more than or equal to the minimum value of the insertion loss and less than or equal to the value determined by adding 3 dB to the minimum value. As shown in FIG. 34 (b), in passband PB2, the insertion loss of multiplexer 4 is substantially identical to the insertion loss of multiplexer 2. Regarding passband PB2, multiplexer 4 implements a similar pass characteristic to multiplexer 2.

As seen from the foregoing, with the multiplexer according to Embodiment 4, the insertion loss can be reduced and the attenuation characteristic in the second passband for the pass characteristic from the common terminal to the first terminal can further be improved relative to the multiplexer according to Embodiment 2.

Embodiment 5

The above description of Embodiments 1 to 4 is given in connection with the multiplexer according to each embodiment having two filters that differ from each other in terms of the passband. The multiplexer according to an embodiment may have three or more filters that differ from each other in terms of the passband. In connection with Embodiment 5, a multiplexer having three filters that differ from each other in terms of the passband is described.

Figure 35:
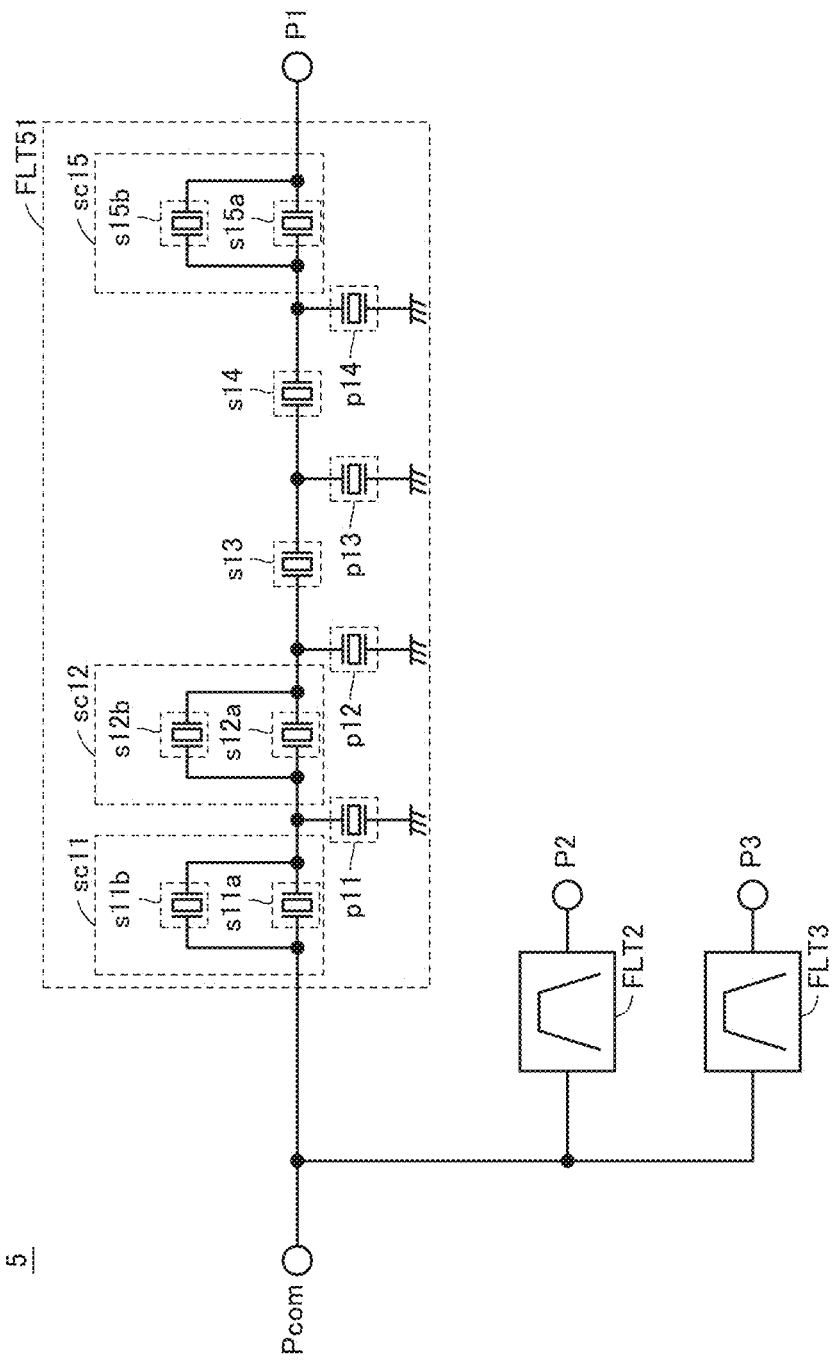
FIG. 35 is a circuit configuration diagram of a multiplexer according to Embodiment 5.

FIG. 35 is a circuit configuration diagram of multiplexer 5 according to Embodiment 5. The configuration of multiplexer 5 corresponds to the configuration of multiplexer 2 in FIG. 18 in which filter FLT1 is replaced with a filter FLT51 and to which a filter FLT3 (third filter) having a passband PB3 (fourth passband) and an input/output terminal P3 (third terminal) are added. The configuration of filter FLT51 corresponds to the configuration of filter FLT1 in which series arm resonator s15 is replaced with a series arm circuit sc15 (second series arm circuit). The configurations of multiplexers 5 and 2 are similar to each other in other respects, and therefore, the description thereof is not repeated herein.

As shown in FIG. 35, series arm circuit sc15 is located closest to input/output terminal P1, among the series arm circuits included in filter FLT51. A signal in passband PB1 from input/output terminal P1 is input to series arm circuit sc15 without being passed through a circuit including an elastic wave resonator. Filter FLT3 is connected between input/output terminal P3 and a connecting point of common terminal Pcom and filter FLT2. Filter FLT3 passes a signal in passband PB3. Passband PB3 is higher than passband PB1 and does not overlap passband PB1.

It is known that the electric power applied to an elastic wave resonator is largest at the antiresonance frequency. Respective antiresonance frequencies of series arm resonators s15a, s15b included in series arm circuit sc15 are not included in passband PB1. The electric power applied to series arm resonators s15a, s15b in passband PB1 is smaller than the electric power applied at the resonance frequency. Thus, series arm circuit sc15 is higher in power durability in passband PB1 than a series arm circuit formed of a single series arm resonator. Series arm circuit sc15 is higher in power durability in passband PB1 than a single series arm resonator. The same applies as well to series arm circuit sc11.

Series arm circuit sc11 that is the first circuit in filter FLT51 to receive a signal from common terminal Pcom and series arm circuit sc15 that is the first circuit in filter FLT51 to receive a signal from input/output terminal P1 receive electric power directly and intensively from common terminal Pcom and input/output terminal P1. Therefore, the power durability of series arm circuits sc11 and sc15 can be enhanced relative to a single series arm resonator to thereby improve the power durability of multiplexer 5.

FIG. 36 shows pass characteristics of multiplexer 5 in FIG. 35. FIG. 36 (a) shows a pass characteristic from common terminal Pcom to input/output terminal P3. FIG. 36 (b) shows a pass characteristic from common terminal Pcom to input/output terminal P1. FIG. 36 (c) shows a pass characteristic from common terminal Pcom to input/output terminal P2.

Figure 37:
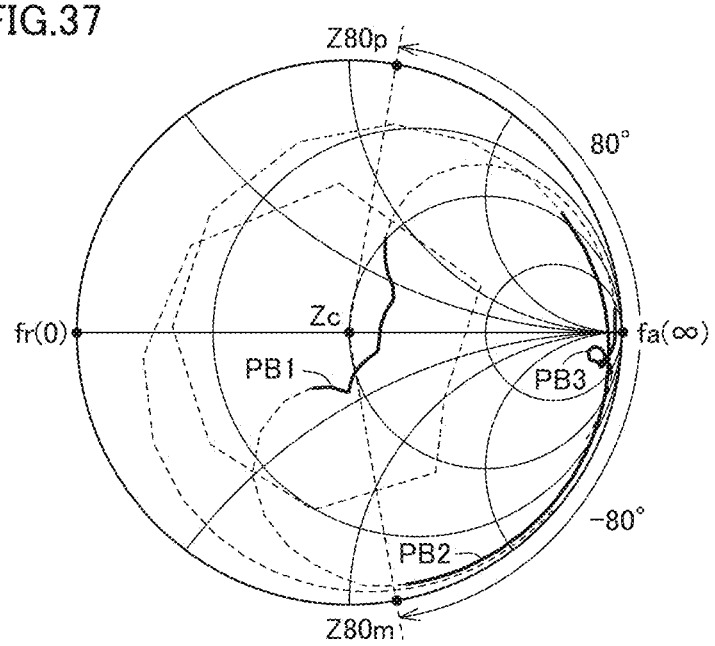
FIG. 37 is a Smith chart showing an impedance as the first filter is seen from the common terminal.

FIG. 37 is a Smith chart showing an impedance as filter FLT 51 is seen from common terminal Pcom. As shown in FIG. 37, the impedance in passband PB1 of filter FLT1 itself is matched with normalized impedance Zc, and therefore distributed around normalized impedance Zc. The phase of passband PB2 ranges from −77 degrees to 30 degrees, and is included in the range from −80 degrees to 80 degrees. The phase of passband PB3 ranges from −9 degrees to 5 degrees, and is included in the range from −80 degrees to 80 degrees.

As seen from the foregoing, with the multiplexer according to Embodiment 5, the insertion loss can be reduced and the power durability in the first passband can be enhanced.

Embodiment 6

In connection with Embodiment 6, a description is given of a radio-frequency front-end circuit and a communication apparatus that can be implemented by means of the multiplexer described in connection with Embodiments 1 to 5.

Figure 38:
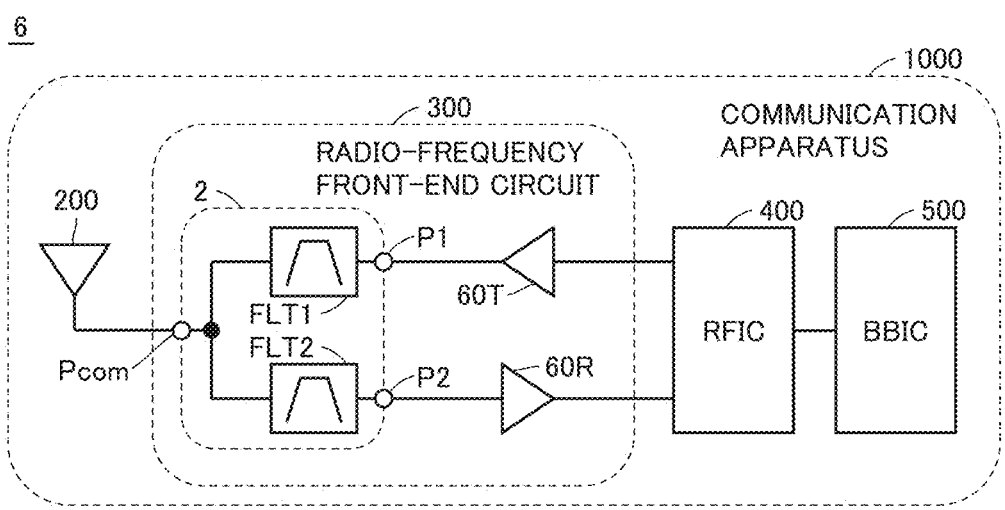
FIG. 38 is a configuration diagram of a communication apparatus according to Embodiment 6.

FIG. 38 is a configuration diagram of a communication apparatus 1000 according to Embodiment 6. As shown in FIG. 38, communication apparatus 1000 includes an antenna element 200, a radio-frequency front-end circuit 300, an RFIC (radio frequency integrated circuit) 400, and a BBIC (baseband integrated circuit) 500.

Radio-frequency front-end circuit 300 includes multiplexer 2 (see FIG. 18), a transmitter amplifier circuit 60T, and a receiver amplifier circuit 60R.

Antenna element 200 is connected to common terminal Pcom. Input/output terminal P1 is connected to transmitter amplifier circuit 60T. To input/output terminal P2, receiver amplifier circuit 60R is connected.

Transmitter amplifier circuit 60T is a power amplifier that amplifies the power of a radio-frequency signal in a predetermined frequency band. Receiver amplifier circuit 60R is a low-noise amplifier that amplifies the power of a radio-frequency signal in a predetermined frequency band.

RFIC 400 processes a radio-frequency signal transmitted and received by antenna element 200. Specifically, RFIC 400 processes, through down-converting for example, a radio-frequency signal that is input from antenna element 200 through a receiver signal path, and outputs the resultant signal to BBIC 500. RFIC 400 processes, through up-converting, for example, a transmission signal that is input from BBIC 500, and outputs the resultant signal.

With the communication apparatus according to Embodiment 6, the communication quality can be improved by the multiplexer with a reduced insertion loss.

The embodiments disclosed herein are also intended to be implemented in the form of an appropriate and consistent combination. It should be construed that the embodiments disclosed herein are given by way of illustration in all respects, not by way of limitation. It is intended that the scope of the present invention is defined by claims, not by the description above, and encompasses all modifications and variations equivalent in meaning and scope to the claims.

The invention claimed is:

1. A multiplexer, comprising:
a common terminal;
a first terminal;
a second terminal;
a first filter located between the common terminal and the first terminal, the first filter passing a signal in a first passband; and
a second filter located between the common terminal and the second terminal, the second filter passing a signal in a second passband, wherein
the second passband is lower than the first passband and does not overlap the first passband,
the first filter comprises a first series arm circuit including a first series arm resonator and a second series arm resonator that are connected to each other,
the first series arm circuit is connected to the common terminal not through a circuit including an elastic wave resonator, the first series arm circuit has a first antiresonance frequency and a second antiresonance frequency higher than the first antiresonance frequency,
the second antiresonance frequency is higher than a higher edge of the first passband,
the first antiresonance frequency is at or lower than a higher edge of the second passband, and
at least one of a first fractional bandwidth of the first series arm resonator and a second fractional bandwidth of the second series arm resonator is larger than a third fractional bandwidth of an elastic wave resonator included in the first filter by 0.8 or more, where a fractional bandwidth of a resonator is a value determined by dividing a difference between an antiresonance frequency and a resonance frequency of the resonator by the resonance frequency.

2. The multiplexer according to claim 1, wherein the first antiresonance frequency is included in the second passband.

3. The multiplexer according to claim 2, wherein the first series arm circuit has a first resonance frequency lower than a lower edge of the second passband and a second resonance frequency included in the first passband.

4. The multiplexer according to claim 3, wherein the first series arm resonator and the second series arm resonator are connected in parallel.

5. The multiplexer according to claim 1, wherein the first series arm resonator and the second series arm resonator are connected in series.

6. The multiplexer according to claim 1, wherein
a resonance frequency of the first series arm resonator is lower than a resonance frequency of the second series arm resonator,
an antiresonance frequency of the first series arm resonator is lower than an antiresonance frequency of the second series arm resonator, and
the first fractional bandwidth is larger than the third fractional bandwidth.

7. The multiplexer according to claim 6, wherein the first fractional bandwidth is larger than the second fractional bandwidth.

8. The multiplexer according to claim 6, wherein
the first filter comprises a longitudinally coupled resonator having a third passband overlapping the first passband,
the longitudinally coupled resonator passes a signal in the first passband and the third passband from the common terminal to the first terminal or from the first terminal to the common terminal,
the longitudinally coupled resonator has one or more attenuation poles in a frequency band lower than a center frequency of the third passband, and
the first fractional bandwidth is larger than a fractional bandwidth of the longitudinally coupled resonator, where the fractional bandwidth of the longitudinally coupled resonator is a value determined by dividing a difference between the center frequency and a frequency of an attenuation pole among the one or more attenuation poles that is located closest to the center frequency, by the frequency of the attenuation pole.

9. The multiplexer according to claim 1, wherein the first series arm resonator comprises:
a first interdigital transducer (IDT) electrode including a plurality of first electrode fingers with a first electrode period; and
a first reflector that includes a plurality of second electrode fingers and reflects an elastic wave excited by the first IDT electrode, and a pitch between a first electrode finger and a second electrode finger adjacent to each other, among the plurality of first electrode fingers and the plurality of second electrode fingers, is more than or equal to $0.42\alpha$ and less than $0.50\alpha$, where $\alpha$ is a wavelength of an elastic wave determined by the first electrode period.

10. The multiplexer according to claim 9, wherein the second series arm resonator comprises:
    a second IDT electrode including a plurality of third electrode fingers with a second electrode period; and
    a second reflector that includes a plurality of fourth electrode fingers and reflects an elastic wave excited by the second IDT electrode, and
    a pitch between a third electrode finger and a fourth electrode finger adjacent to each other, among the plurality of third electrode fingers and the plurality of fourth electrode fingers, is more than or equal to $0.44\beta$, where $\beta$ is a wavelength of an elastic wave determined by the second electrode period.

11. The multiplexer according to claim 10, wherein an aspect ratio of the first series arm resonator is larger than an aspect ratio of the second series arm resonator, where an aspect ratio of a series arm resonator is a ratio of a cross width of an IDT electrode of the series arm resonator to the number of pairs of electrode fingers included in the IDT electrode.

12. The multiplexer according to claim 1, wherein a phase of an impedance in the second passband of the first filter as seen from the common terminal is more than or equal to −80 degrees and less than or equal to 80 degrees.

13. The multiplexer according to claim 1, wherein the first filter further comprises a second series arm circuit having a third antiresonance frequency and a fourth antiresonance frequency higher than the third antiresonance frequency,
    the fourth antiresonance frequency is higher than the higher edge of the first passband, and
    the third antiresonance frequency is at or lower than the higher edge of the second passband.

14. The multiplexer according to claim 13, wherein the second series arm circuit is connected to the first terminal not through a circuit, the circuit including an elastic wave resonator and different from the second series arm circuit is not connected to a signal line between the first terminal and the second series arm circuit.

15. The multiplexer according to claim 1, further comprising:
    a third terminal; and
    a third filter located between the common terminal and the third terminal, the third filter passing a signal in a fourth passband from the common terminal to the third terminal or from the third terminal to the common terminal, wherein
    the fourth passband is higher than the first passband and does not overlap the first passband, and
    the second antiresonance frequency is included in the fourth passband.

16. The multiplexer according to claim 15, wherein a phase of an impedance in the fourth passband of the first filter as seen from the common terminal is more than or equal to −80 degrees and less than or equal to 80 degrees.

17. A radio-frequency front-end circuit, comprising:
    an amplifier circuit; and
    a multiplexer electrically connected to the amplifier circuit, the multiplexer comprising:
    a common terminal;
    a first terminal;
    a second terminal;
    a first filter located between the common terminal and the first terminal, the first filter passing a signal in a first passband; and
    a second filter located between the common terminal and the second terminal, the second filter passing a signal in a second passband, wherein
    the second passband is lower than the first passband and does not overlap the first passband,
    the first filter comprises a first series arm circuit including a first series arm resonator and a second series arm resonator that are connected to each other,
    the first series arm circuit is connected to the common terminal not through a circuit including an elastic wave resonator,
    the first series arm circuit has a first antiresonance frequency and a second antiresonance frequency higher than the first antiresonance frequency,
    the second antiresonance frequency is higher than a higher edge of the first passband,
    the first antiresonance frequency is at or lower than a higher edge of the second passband, and
    at least one of a first fractional bandwidth of the first series arm resonator and a second fractional bandwidth of the second series arm resonator is larger than a third fractional bandwidth of an elastic wave resonator included in the first filter by 0.8 or more, where a fractional bandwidth of a resonator is a value determined by dividing a difference between an antiresonance frequency and a resonance frequency of the resonator by the resonance frequency.

18. A communication apparatus, comprising:
    a radio frequency (RF) signal processor circuit that processes a radio-frequency signal transmitted and received by an antenna; and
    the radio-frequency front-end circuit according to claim 17 that transmits the radio-frequency signal between the antenna and the RF signal processor circuit.

19. A multiplexer, comprising:
    a common terminal;
    a first terminal;
    a second terminal;
    a first filter located between the common terminal and the first terminal, the first filter passing a signal in a first passband; and
    a second filter located between the common terminal and the second terminal, the second filter passing a signal in a second passband, wherein
    the second passband is lower than the first passband and does not overlap the first passband,
    the first filter comprises a first series arm circuit including a first series arm resonator and a second series arm resonator,
    the first series arm circuit is connected to the common terminal not through a circuit including an elastic wave resonator,
    the first series arm circuit has a first antiresonance frequency and a second antiresonance frequency higher than the first antiresonance frequency,
    the second antiresonance frequency is higher than a higher edge of the first passband,
    the first antiresonance frequency is at or lower than a higher edge of the second passband,
    the first filter further comprises a second series arm circuit having a third antiresonance frequency and a fourth antiresonance frequency higher than the third antiresonance frequency, the fourth antiresonance frequency is higher than the higher edge of the first passband, the third antiresonance frequency is at or lower than the higher edge of the second passband, the second series arm circuit is connected to the first terminal through a circuit, the circuit including an elastic wave resonator, the circuit being different from the second series arm circuit, and the circuit being connected to a signal line between the first terminal and the second series arm circuit, the second series arm circuit passes a signal in the first passband from the common terminal to the first terminal or from the first terminal to the common terminal, and the second series arm circuit includes a third series arm resonator and a fourth series arm resonator.

* * * * *